(12) United States Patent
Katsui

(10) Patent No.: US 6,345,664 B1
(45) Date of Patent: *Feb. 12, 2002

(54) HEAT SINK AND INFORMATION PROCESSOR USING HEAT SINK

(75) Inventor: Tadashi Katsui, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/026,649

(22) Filed: Feb. 20, 1998

(30) Foreign Application Priority Data

Feb. 24, 1997 (JP) ............................................. 9-039468
May 28, 1997 (JP) ............................................. 9-138852
Nov. 4, 1997 (JP) ............................................. 9-301991

(51) Int. Cl.⁷ .................................................. F28F 7/00
(52) U.S. Cl. .............................. 165/80.3; 165/104.33; 165/125; 165/185; 361/700; 257/715; 174/15.2
(58) Field of Search ........................... 165/104.33, 122, 165/80.4, 81.3, 185; 361/687, 700; 257/715; 174/15.2

(56) References Cited

U.S. PATENT DOCUMENTS

| | | | | |
|---|---|---|---|---|
| 5,095,404 A | * | 3/1992 | Chao ................. | 165/104.33 X |
| 5,161,090 A | * | 11/1992 | Crawford et al. ... | 165/104.33 X |
| 5,297,617 A | * | 3/1994 | Herbert ................. | 165/80.3 |
| 5,329,425 A | * | 7/1994 | Leyssens et al. ... | 165/104.33 X |
| 5,339,214 A | | 8/1994 | Nelson ................. | 361/695 |
| 5,413,167 A | * | 5/1995 | Hara et al. .......... | 165/104.33 X |
| 5,441,102 A | * | 8/1995 | Burward-Hoy .... | 165/104.33 X |
| 5,445,215 A | * | 8/1995 | Herbert ............... | 165/80.3 |

(List continued on next page.)

FOREIGN PATENT DOCUMENTS

| | | | | |
|---|---|---|---|---|
| DE | 296 11 158 U1 | 10/1996 | | |
| EP | 0 690 502 A1 | 1/1996 | | |
| EP | 0 732 741 A2 | 9/1996 | | |
| GB | 1521464 | * | 8/1979 | ............ 165/104.33 |
| GB | 1595961 | * | 8/1981 | ............ 165/104.33 |
| JP | 0119659 | * | 7/1983 | ............ 165/104.33 |
| JP | 60050948 | | 3/1985 | |
| JP | 6-268125 | | 9/1994 | |

OTHER PUBLICATIONS

XP 326592 "Air–Cooled Heat Sinks with Flow Diverters," p. 861, Nov., 1992 No. 3343, Emsworth, GB.
XP 294003 "IMB ES/9000 Model 320 Air Cooled Computer Technology," Venkappa Gani, et al., IEEE—pp. 309–313.
XP 312960, "Air Baffle For Planar Memory Cooling," pp. 235–236, vol. 35, No. 5, Oct. 1992, IBM Technical Disclosure Bulletin.
XP 520664, "Ducted Heat Pipe System in Mobile PC Systems," pp. 289–290, vol. 38, No. 06, Jun. 1995, IBM Technical Disclosure Bulletin.
XP 588228, "Integrated Heat Pipe Fan," pp. 531–532, vol. 38, No. 12, Dec. 1995, IBM Technical Disclosure Bulletin.

*Primary Examiner*—Christopher Atkinson
(74) *Attorney, Agent, or Firm*—Armstrong, Westerman, Hattori, McLeland, & Naughton, LLP

(57) ABSTRACT

The present invention relates to a heat sink. More particularly, the present invention relates to a heat sink used for radiating heat from an integrated circuit package such as a micro-processor arranged in a portable type electronic apparatus such as a notebook type personal computer and also used for radiating heat from a hard disk unit used in an electronic apparatus. The heat sink comprises: a heat transmitting member for transmitting heat generated by a heating component; a holding section for holding the heat transmitting member; and a heat sink body having a space in which a cooling fan having at least blades and a drive motor is embedded, wherein a portion of the holding section for holding the heat transmitting member, the portion being located below the space, is cut out.

5 Claims, 36 Drawing Sheets

U.S. PATENT DOCUMENTS

| | | | |
|---|---|---|---|
| 5,504,650 A | | 4/1996 | Katsui et al. ................ 361/697 |
| 5,699,854 A | * | 12/1997 | Hong ...................... 165/122 X |
| 5,793,611 A | * | 8/1998 | Nakazato et al. ... 165/104.33 X |
| 5,842,514 A | * | 12/1998 | Zapach et al. ......... 165/104.33 |
| 5,964,279 A | * | 10/1999 | Mochizuki et al. .... 165/80.3 X |
| 5,966,286 A | * | 10/1999 | O'Connor et al. ..... 165/80.3 X |
| 5,969,943 A | * | 10/1999 | Oyamada ............... 165/80.3 X |
| 5,983,995 A | * | 11/1999 | Shuton et al. ............. 165/80.3 |
| 6,118,655 A | * | 9/2000 | Mecrely, III et al. .. 165/80.3 X |

* cited by examiner

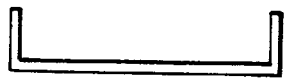
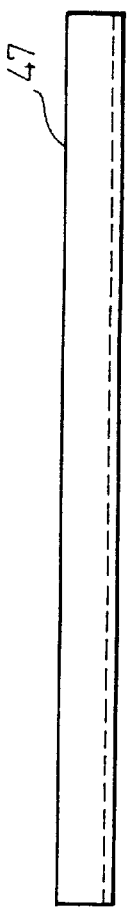
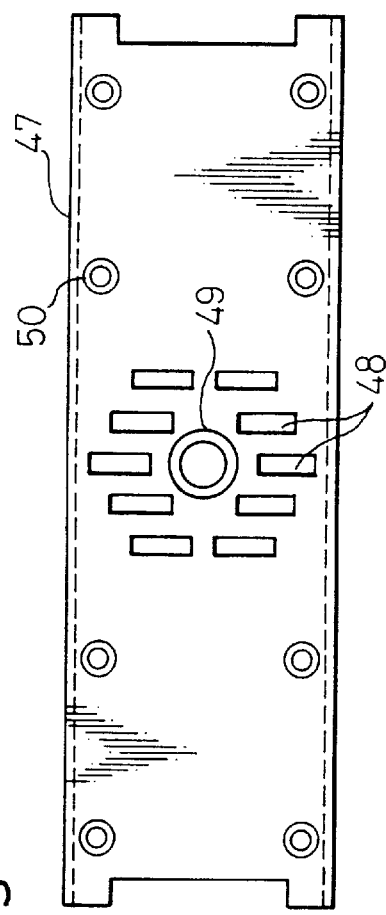
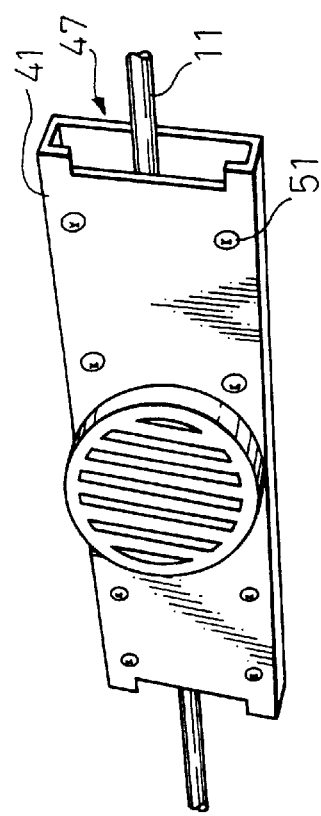

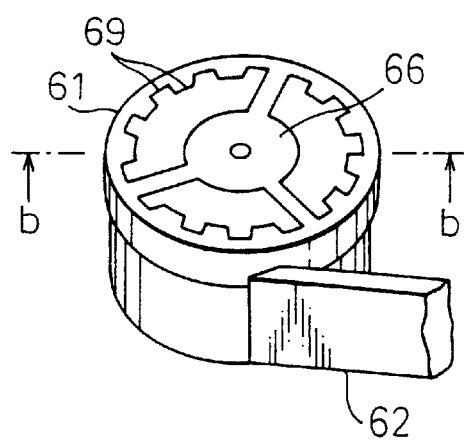
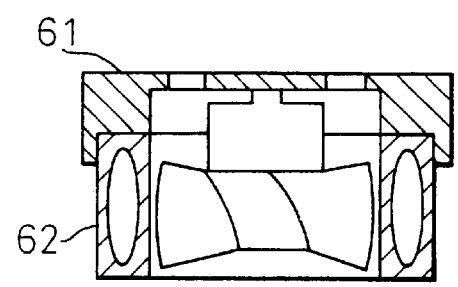
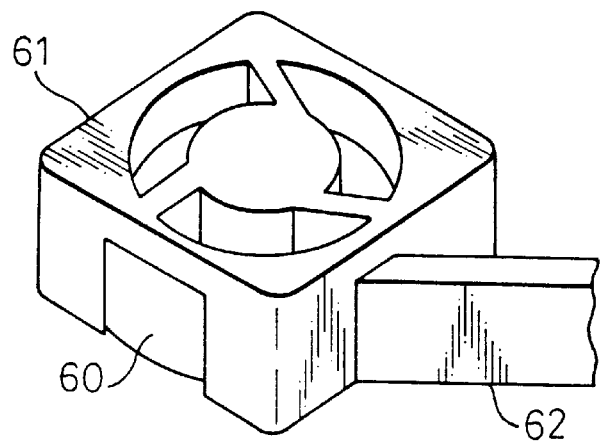

CUTAWAY SURFACE

CASING ON THE SIDE OF HIGH WIND PRESSURE

SUCTION PORT OR
DISCHARGE PORT h: FIN HEIGHT

W: CLEARANCE

HEAT SINK AND INFORMATION PROCESSOR USING HEAT SINK

BACKGROUND OF THE INVENTION

1. Field of the Invention

The present invention relates to a heat sink. More particularly, the present invention relates to a heat sink used for diffusing heat generated by an integrated circuit package, in which heat is generated, such as a microprocessor unit incorporated into portable electronic equipment such as a notebook-type computer. Also, the present invention relates to a heat sink used for diffusing the heat generated by a hard disk device incorporated into portable electronic equipment.

2. Description of the Related Art

Recently, a microprocessor of high performance has been incorporated into a portable type electronic equipment for the purpose of increasing the processing speed and the processing capacity. A quantity of heat generated by this microprocessor is larger than the quantity of heat generated by other electronic parts. Therefore, the microprocessor by which a large quantity of heat is generated is locally air-cooled by a heat sink.

Concerning the heat sink used for locally cooling the microprocessor, there is provided a heat sink which is naturally cooled and further forcibly cooled for enhancing the cooling capacity in such a manner that a cooling fan is set on the naturally cooled heat sink. Also, in order to reduce the dimensions of the apparatus, as disclosed in Japanese Unexamined Patent Publication No. 6-268125, there is provided a heat sink in which a cooling fan is embedded.

However, the prior art disclosed in Japanese Unexamined Patent Publication No. 6-268125 is disadvantageous in that the height of the heat sink is increased because the heat sink into which the fan is incorporated is attached onto a heating component.

In order to solve the above problems, there is disclosed a technique in which a heating component is cooled by a heat sink in such a manner that the heating component is mounted at a position distant from the heat sink, and the heating component is connected with the heat sink by a heat pipe, and heat which has been generated by the heating component is transmitted to the heat sink via the heat pipe. In the above case, for example, it is possible to arrange the heating component and the heat sink in the transverse direction. Accordingly, the height of the apparatus can be reduced.

Even in the above prior art in which the heat pipe is used, it is necessary to improve the heat sink so that the cooling performance of the heat sink can be enhanced to diffuse a large quantity of heat generated by the heating component. In order to meet the above requirements, there is disclosed a technique in which a heat sink is combined with a cooling fan so that the heat sink can be cooled by means of forcible cooling in addition to natural cooling. When the heat sink is combined with the cooling fan according to the above prior art, a conventional fan is used, which is set on a conventional heat sink. A heating component mounted at a position distant from the heat sink is connected with the heat sink by a heat pipe. By this heat transmitting member, heat generated by the heating component is transmitted to the heat sink, and the heat sink is forcibly air-cooled by a cooling fan.

However, according to the above prior art in which the heat pipe is used, the cooling fan is placed upon the heat sink. Accordingly, it is necessary to provide a space into which the cooling fan is incorporated in addition to a space into which the heat sink is incorporated.

Further, in this example in which the heat pipe is used, the entire circumference of the heat pipe is surrounded by a bottom plate of the heat sink, and the diameter of the heat pipe is increased by the thickness of the heat sink. For the above reasons, a space in which the heat pipe is attached is increased within the height of the heat sink. Therefore, it becomes difficult to ensure a space in which the cooling fan is embedded in the heat sink. This space, in which the cooling fan is embedded, cannot be ensured in the heat sink. The cooling fan protrudes out of the heat sink. Therefore, it is impossible to reduce the thickness of the apparatus.

Even if the height of the heat sink is increased so as to embed the cooling fan in the heat sink, it is impossible to meet the requirements of a portable type information processor, the thickness of which has been increasingly reduced.

When the heat sink in which the cooling fan is embedded is mounted on the heating component, it is necessary to provide a space on the heating component into which the heat sink is incorporated. When it is attempted to mount the heat sink on the printed board on which the heating component is mounted, it is impossible to ensure a space into which the heat sink is incorporated because the density of mounting parts on the printed board has been increased.

SUMMARY OF THE INVENTION

The object of the present invention is to realize a reduction of the thickness of a heat sink. It is another object of the present invention to realize a reduction of the thickness of an apparatus.

According to the first aspect of the invention, there is provided a heat sink comprising: a heat transmitting member for transmitting heat generated by a heating component; a holding section for holding the heat transmitting member; and a heat sink body having a space in which a cooling fan having at least blades and a drive motor is embedded, wherein a portion of the holding section for holding the heat transmitting member, the portion being located below the space, is cut out.

According to this aspect, the thickness of the holding section of the heat sink for holding the heat transmitting member is removed. Therefore, it becomes possible to deeply embed the cooling fan in the heat sink in accordance with a reduction in the thickness. Therefore, the thickness of the heat sink can be reduced.

According to the 2nd aspect of the invention, there is provided a heat sink in which the heat sink body is accommodated in a box for controlling a flow of air generated by the cooling fan. That is, according to this aspect, other electronic parts mounted in the periphery of the heat sink can be effectively cooled by cooling air, and also the cooling fan can be protected.

According to the 3rd aspect of the invention, there is provided a heat sink, further comprising a printed board for holding the cooling fan, wherein the printed board has ventilation holes in which an air flow generated by the fan assembly flows, and a portion of the drive circuit to drive the motor is mounted on the printed board. That is, according to this aspect, the printed board necessary for driving the drive motor is also used as a cover for holding the cooling fan. Therefore, it is unnecessary to provide a specific cover member. In accordance with that, the thickness of the heat sink can be reduced. Further, when a portion of the driving circuit is mounted in an empty space on the mounting surface of the printed board, the printed board can be effectively utilized.

According to the 4th aspect of the invention, there is provided a heat sink further comprising a cover to be put on the heat sink body, wherein the cover has a spacer, the height of which is sufficiently large for forming an air gap on the surface of the heat sink body, and also the cover has a hole to fix a bearing of the cooling fan. That is, according to this aspect, there is formed an air gap between the heat sink and the cover. Since this air gap is used as a passage for the cooling air sent from the cooling fan, and even if other parts are densely mounted on the cover, it is possible to ensure a passage of the cooling air. Further, when the cooling fan is fixed at two positions in such a manner that one position is on the printed board and the other position is on the cover, it is possible to fix the cooling fan firmly.

According to the 5th aspect of the invention, there is provided a heat sink in which peripheries of the blades in the depth direction are surrounded by a venturi. According to this aspect, it is possible to regulate the flow of the air sucked by the cooling fan, so that the occurrence of a whirling loss can be decreased and the cooling fan can be effectively driven.

According to the 6th and 7th aspect of the invention, there are provided a heat sink and an information processor each comprising: a heat transmitting member for transmitting heat generated by a heating component; a holding section for holding the heat transmitting member; and a heat sink body having a space in which a cooling fan having at least blades and a drive motor is embedded, the heat sink body being arranged at a position different from a position at which the heating component is arranged, wherein heat generated by the heating component is transmitted by the heat transmitting member and removed by the heat sink body. That is, the heating component and the heat sink are mounted being shifted at different positions. Therefore, the height of the heat sink can be reduced when the heating component is cooled. Further, the cooling fan is embedded in the heat sink, i.e., the cooling fan can be accommodated in the heat sink. Therefore, it is possible to reduce the thickness of the heat sink. When the thickness of the heat sink is reduced, the thickness of the information processor into which the heat sink is incorporated can be also reduced.

According to the 8th aspect of the invention, there is provided an information processor comprising: a heat transmitting member for transmitting heat generated by a heating component; a holding section for holding the heat transmitting member; and a heat sink body having a space in which a cooling fan having at least blades and a drive motor is embedded, wherein the heat sink body is embedded in a frame of the apparatus. According to this aspect, the heat sink, the thickness of which is reduced by embedding the cooling fan in it, is further embedded in the frame of the apparatus. Accordingly, the heat sink can be accommodated in the apparatus. Therefore, the mounting space of the heat sink, which is commonly located on the heating component or in the periphery of the heating component, is not limited to a specific position, and the heat sink can be mounted at an arbitrary position in accordance with the layout of other mounting parts. Consequently, the degree of freedom of installing the heat sink can be increased, and the dimensions of the apparatus can be reduced.

According to the 9th aspect of the invention, there is provided an information processor further comprising rod-shaped fins for partially closing ventilation holes of the cooling fan embedded in the heat sink body. That is, according to this aspect, the rod-shaped fins are arranged in the middle of the air passage. Therefore, heat can be diffused from these rod-shaped fins. Accordingly, the cooling performance can be enhanced.

According to the 10th aspect of the invention, there is provided an information processor wherein peripheries of the blades in the depth direction are surrounded by a venturi. According to this aspect, it is possible to regulate a flow of the air sucked by the cooling fan, so that the occurrence of a whirling loss can be decreased and the cooling fan can be effectively driven.

According to the 11th aspect of the invention, there is provided an information processor wherein ventilation holes are formed on a surface of the heat sink body located on the side of the heating component. That is, according to this aspect, when the number of ventilation holes for the heat sink, in which the cooling fan is embedded, is increased, it is possible to increase the quantity of air, so that the cooling performance can be enhanced.

According to the 12th aspect of the invention, there is provided an information processor wherein suction holes connected to the heat sink body are formed in the frame of the apparatus and ventilation holes are formed in the heat sink body corresponding to the suction holes. That is, according to this aspect, a wind, the temperature of which is lower than the temperature in the apparatus, can be taken in via the suction holes formed in the frame and also via the ventilation holes formed in the heat sink corresponding to the suction holes. Accordingly, the cooling performance can be enhanced.

According to the 13th aspect of the invention, there is provided a heat sink comprising: a heat conveyance member for transmitting heat generated by a heating component; and a centrifugal blower section composed of a cover having blades and a drive motor and also composed of a casing made of highly conductive material, wherein the heat conveyance member adheres to an outer circumference of the casing or a portion of the outer circumference of the casing. That is, according to this aspect, when the heat transmitting member is made to adhere onto the entire outer circumference of the casing of the blower or a portion of the outer circumference, it is possible to increase a heat exchanging area in the casing section at which the air pressure is high. Accordingly, the cooling performance can be enhanced.

According to the 14th aspect of the invention, there is provided a heat sink comprising: a heat conveyance member for transmitting heat generated by a heating component; and a cross flow fan section composed of blades and a drive motor and also composed of a casing made of good conductive material, wherein the heat conveyance member adheres to an outer circumference of the casing or a portion of the outer circumference of the casing. That is, according to this aspect, a cross flow fan is adopted. Therefore, it is possible to suck and discharge air at the sides of the fan. Accordingly, the thickness of the apparatus can be reduced.

According to the 15th aspect of the invention, there is provided a heat sink comprising: a heat conveyance member for transmitting heat generated by a heating component; a heat exchanging section adhering to the heat conveyance member for exchanging heat; and an axial blower, wherein the heat exchanging section has a ventilating passage inside in the height direction of the blower, and the heat conveyance member adheres to the heat exchanging section. That is, according to this aspect, there is provided a ventilation passage in the heat exchanging section. Accordingly, it is possible to exhaust air from the apparatus, and it is also possible to diffuse heat conveyed by the heat conveyance member. Consequently, the cooling efficiency of the apparatus can be enhanced.

According to the 16th aspect of the invention, there is provided a heat sink comprising: a heat conveyance member for transmitting heat generated by a heating component; an axial blower section having blades, a drive motor and a casing made of a highly conductive material; and a heat exchanging section to which the heat conveyance member adheres so as to exchange heat, wherein the casing is extended in the height direction to form the heat exchanging section, and the heat conveyance member is made to adhere to the heat exchanging section. That is, according to this aspect, the heat exchanging section to which the heat conveyance member adheres is made of the same material as that of the casing of the fan. Therefore, the contact heat resistance is reduced, so that the cooling efficiency can be enhanced.

According to the 17th aspect of the invention, there is provided a heat sink comprising: a heat conveyance member for transmitting heat generated by a heating component; and an axial blower section having blades, a drive motor and a casing made of a highly conductive material, wherein the heat conveyance member is made to adhere onto the outer circumference of the casing or a portion of the outer circumference of the casing. That is, according to this aspect, the heat conveyance member is made to adhere onto the outer circumference of the casing. Therefore, the height can be decreased.

According to the 18th aspect of the invention, there is provided a heat sink comprising: a heat conveyance member for transmitting heat generated by a heating component; and an axial blower section having blades, a drive motor and a casing made of a highly conductive material, wherein the casing is composed of the heat conveyance member. That is, according to this aspect, the heat conveyance member is also used as a casing of the fan. Therefore, it is possible to reduce the dimensions by the thickness of the casing required for the fan.

According to the 19th aspect of the invention, there is provided a heat sink comprising: a heat conveyance member for transmitting heat generated by a heating component; and a heat sink body into which a fan and heat radiating fins are incorporated, wherein the heat conveyance member is made to adhere onto the side of the heat sink body. That is, according to this aspect, the heat conveyance member is made to adhere onto the side of the heat sink. Therefore, the contact heat resistance is reduced, so that the cooling efficiency can be enhanced.

According to the 20th aspect of the invention, there is provided a heat sink wherein the casing is divided into parts within the height of the adhering section in which the casing and the heat conveyance member adhere to each other. That is, according to this aspect, the manufacturing property and the assembling property can be enhanced, so that the manufacturing cost can be reduced.

According to the 21st aspect of the invention, there is provided a heat sink wherein the heat conveyance member is formed into a cylinder or a portion of the heat conveyance member is formed into a cylinder, and the heat conveyance member is made to adhere to the casing. That is, according to this aspect, the heat exchanging area is increased. Therefore, the cooling efficiency can be enhanced.

According to the 22nd aspect of the invention, there is provided a heat sink wherein a section of the groove of the casing or a section of the groove of the heat sink body into which the heat conveyance member is made to adhere is formed into a circle. That is, according to this aspect, the heat exchanging area is increased. Therefore, the cooling efficiency can be enhanced.

According to the 23rd aspect of the invention, there is provided a heat sink wherein a section of the casing and a section of the heat sink body to which the heat conveyance member is made to adhere are formed into a rectangle. That is, according to this aspect, the heat exchanging area is increased. Therefore, the cooling efficiency can be enhanced.

According to the 24th aspect of the invention, there is provided a heat sink, wherein heat radiating fins made of the same material as that of the casing are formed in the heat sink body close to the discharge port of the fan. That is, according to this aspect, discharged air collides with the heat radiating fins. Therefore, the cooling efficiency can be enhanced.

According to the 25th aspect of the invention, there is provided a heat sink wherein the heat exchanging section to exchange heat with the heat conveyance member is provided on the casing portion exposed to a high air pressure from the fan, and on the side portion of the heat sink body adjacent to the casing portion. That is, according to this aspect, the heat exchanging section in which heat is exchanged with the heat conveyance member is provided in a portion where the air pressure from the fan is high so that the cooling efficiency is high. Therefore, the dimensions can be reduced while the deterioration of the performance is minimized.

According to the 26th aspect of the invention, there is provided a heat sink wherein the height of the heat radiating fin is increased to the height of the air gap formed in the sucking section. That is, according to this aspect, a portion necessary for sucking air is open, and a portion unnecessary for sucking a wind is utilized for increasing the heat radiating area. Therefore, the cooling efficiency can be enhanced.

According to the 27th aspect of the invention, there is provided a heat sink wherein the base thickness of the bottom of the heat sink body is thick in a portion close to the heat exchanging section in which heat is exchanged with the heat conveyance member, and the base thickness of the bottom of the heat sink body is gradually decreased as it becomes distant from the heat exchanging section. That is, according to this aspect, it is possible to diffuse and transmit the heat from the heat exchanging section of high temperature to other portions. Therefore, the cooling efficiency can be enhanced.

According to the 28th aspect of the invention, there is provided a heat sink wherein a protruded and cutout heat radiating section is provided on the side on the inner circumference of the casing except for the discharge port of the fan and also on the inner surface of the outer shell of the heat sink body. That is, according to this aspect, a turbulent flow is generated by the protruded and cutout heat radiating section arranged in a portion where the wind pressure of the fan is highest and also in a portion closest to the heat exchanging section of high temperature. Therefore, the cooling efficiency can be enhanced.

According to the 29th aspect of the invention, there is provided a heat sink wherein the heat sink body includes fins arranged close to the discharge port of the fan in such a manner that lines connecting the fins are parallel to the direction of discharged air. That is, according to this aspect, the resistance, caused by the fins, on a flow of air is decreased, so that a quantity of ventilating air is increased. Accordingly, the cooling efficiency can be enhanced.

According to the 30th aspect of the invention, there is provided a heat sink wherein the heat sink body includes fins arranged close to the discharge port of the fan in such a manner that the fins are arranged at random with respect to the direction of a discharging wind. That is, according to this aspect, a wind collides with the fins arranged at random. Accordingly, the cooling efficiency can be enhanced.

According to the 31st aspect of the invention, there is provided a heat sink wherein a guide for determining a ratio of suction of the outside air to the inside air is provided at the suction port of the fan. That is, according to this aspect, the outside air, the temperature of which is relatively low, is taken in, so that the cooling efficiency can be enhanced, and the inside air, the temperature of which is raised when the electronic parts and units in the apparatus are heated, is discharged outside. Accordingly, the cooling efficiency to cool the apparatus can be enhanced.

According to the 32nd aspect of the invention, there is provided a heat sink wherein the inside of the edge on the high air pressure side of the heat sink body close to the discharge port of the fan protrudes in the direction of an air flow. That is, according to this aspect, the mount is formed at a position where air from the fan is weakest, that is, the mount is formed in a dead zone. Accordingly, it is possible to fix the cover by the protruding section while the deterioration of the air-flow efficiency is minimized.

According to the 33rd aspect of the invention, there is provided a heat sink wherein a hole in which a wind flows is formed on the side, at a low air pressure of the heat sink body close to the discharge port of the fan. That is, according to this aspect, it is possible to increase the area of the opening, through which air from the fan passes. Accordingly, the cooling efficiency to cool the apparatus can be enhanced.

According to the 34th aspect of the invention, there is provided an information processor comprising: a suction port of the heat sink arranged on one surface of the corner section of the apparatus; and a discharge port of the heat sink arranged on the other surface of the corner section of the apparatus. That is, according to this aspect, the heat sink is arranged at the corner of the apparatus. Accordingly, it is not necessary to provide an air duct, and the manufacturing cost of the apparatus can be reduced.

According to the 35th aspect of the invention, there is provided a heat sink wherein the heat sink body for heat radiation is arranged at the edge close to the heat exchanging section. That is, according to this aspect, the heat sink for heat radiation is arranged at a position closest to the heat exchanging section of high temperature. Accordingly, a whirling air flow generated at a position close to the fan collides with the heat sink. Accordingly, the cooling efficiency can be enhanced.

According to the 36th aspect of the invention, there is provided a heat sink wherein an air gap is formed between the blades of the fan and the heat exchanging section. That is, according to this aspect, the air gap is formed between the blades of the fan and the heat exchanging section. Accordingly, the intensity of the noise can be lowered.

According to the 37th aspect of the invention, there is provided a heat sink comprising: a heat conveyance member for transmitting heat generated by a heating component; a heat exchanging section adhering to the heat conveyance member so as to exchange heat; and an axial fan, wherein a portion of the heat exchanging section is arranged on the side of the fan, fins are arranged at the suction or discharge port of the fan, and the heat conveyance member is made to adhere to the heat exchanging section. That is, according to this aspect, a ventilation passage is formed inside the heat exchanging section. Accordingly, while the deterioration of the air blasting capacity is minimized, air can be exhausted from the inside of the apparatus, and heat can be diffused from the heat conveyance member. Accordingly, the cooling efficiency of the apparatus can be enhanced.

According to the 38th aspect of the invention, there is provided a heat sink comprising: a heat transmitting member for transmitting heat generated by a heating component; and a cross flow fan section, in which the direction of a suction wind and the direction of a discharge wind are the same, including fan blades, a drive motor and a casing made of heat conductive material, wherein the heat transmitting member is fixed to the outer circumference of the casing or fixed to a portion of the outer circumference of the casing. In other words, according to this aspect, the current of a suction wind and that of a discharge wind are aligned on a straight line. Therefore, it is possible to arrange the heat sink of the invention at any position in the casing as long as it comes into contact with the circumferential wall of the casing. Accordingly, when the heat sink is mounted on the apparatus, the degree of freedom to determine its mounting position can be enhanced.

According to the 39th aspect of the invention, in the heat sink, radiating fins are provided in a portion close to the discharge port of the fan, the radiating fins are made of the same material as that of the casing, the heights of the radiating fins are smaller than the height of the discharge port, and a space is formed in an upper portion of the radiating fins. That is, according to this aspect, when a space is formed in an upper portion of the radiating fins, the air quantity can be increased, and when a ratio of the height of the radiating fin to the height of the upper space formed above the radiating fins is appropriately determined, the cooling efficiency can be enhanced.

According to the 40th aspect of the invention, in the heat sink, the casing is formed into a shape so that the radius of curvature of the heat transmitting member attached along the outside of the casing can be minimized as long as the heat transmitting member can be formed. According to this aspect, the contact length of the casing with the heat transmitting member, that is, the contact area of the casing with the heat transmitting member can be extended to the maximum. Therefore, the cooling efficiency can be enhanced.

According to the 41st aspect of the invention, there is provided a heat sink comprising: a heat transmitting member for transmitting heat generated by a heating component; fan blades; a drive motor; and a casing made of heat conductive material, wherein the bottom of the casing is cut away to the same size as that of the fan blades, or to a size larger than that of the fan blades. According to this aspect, the casing has no bottom portion. Therefore, the height of the casing can be reduced by the thickness of the bottom portion. Consequently, the heat sink can be made thin.

According to the 42nd aspect of the invention, in the heat sink, a plurality of protrusions or spaces are provided on the bottom surface of the casing. According to this aspect, there is provided a clearance between the bottom surface of the casing and the apparatus on which the heat sink is mounted, and a cooling wind flows in the clearance. Therefore, the cooling performance can be enhanced.

According to the 43rd aspect of the invention, in the heat sink, a flat type heat transmitting member is attached onto the bottom surface of the casing so that the heat transmitting area of the heat transmitting member can come into contact with the bottom surface of the casing. According to this aspect, the heat transmitting member is formed flat. Therefore, the contact area of the heat transmitting member with the casing is extended. Therefore, a quantity of heat transmitted by the heat transmitting member is increased, and the cooling performance can be enhanced.

BRIEF DESCRIPTION OF THE DRAWINGS

These and other objects of the present invention will become apparent from the following detailed description of the preferred embodiment of the invention, taken in connection with the accompanying drawings.

In the drawings:

FIGS. 1A, 1B, 1C, and 1D are views showing the first embodiment of the present invention, wherein FIG. 1A is a perspective view, FIG. 1B is an upper view, FIG. 1C is a front view, and FIG. 1D is a side view;

FIGS. 3A and 3B are views showing the third embodiment of the present invention, wherein FIG. 3A is a perspective view, and FIG. 3B is a cross-sectional view taken on line b—b in FIG. 3A;

FIGS. 8A, 8B, and 8C are views showing the eighth embodiment of the present invention, wherein FIG. 8A is an assembled perspective view, FIG. 8B is an exploded perspective view, and FIG. 8C is a perspective view showing another example of the venturi;

FIGS. 9A, 9B, and 9C are views showing the ninth embodiment of the present invention, wherein FIG. 9A is a front view of the heat sink body, FIG. 9B is a view taken in the direction of arrow Z in FIG. 9A, and FIG. 9C is a view taken in the direction of arrow Y in FIG. 9B;

FIGS. 10A, 10B, 10C, and 10D are views showing the ninth embodiment of the present invention, wherein FIG. 10A is an upper view of the cover, FIG. 10B is a front view, FIG. 10C is a side view, and FIG. 10D is an assembled perspective view;

FIGS. 13A and 13B are views showing the eleventh embodiment of the present invention, wherein FIG. 13A is an assembled perspective view and FIG. 13B is a view showing a state of use of the eleventh embodiment;

FIGS. 14A, 14B, and 14C are views showing the twelfth embodiment of the present invention, wherein FIG. 14A is an exploded perspective view, FIG. 14B is a view showing a state of use of the twelfth embodiment, and FIG. 14C is an assembled cross-sectional view;

FIGS. 15A, 15B, and 15C are views showing the thirteenth embodiment of the present invention, wherein FIG. 15A is a perspective view showing a state in which the cover is removed, FIG. 15B is an assembled perspective view, and FIG. 15C is a schematic illustration showing a mode of operation;

FIGS. 16A, 16B, 16C, and 16D are views showing the fourteenth embodiment of the present invention, wherein FIG. 16A is an assembled perspective view, and FIGS. 16B to 16D are views showing a variation of FIG. 16A;

FIGS. 17A, 17B, and 17C are views showing the fifteenth embodiment of the present invention, wherein FIG. 17A is an assembled perspective view, FIG. 17B is a cross-sectional view of FIG. 17A, and FIG. 17C is a view showing a variation of FIG. 17A;

FIGS. 18A and 18B are views showing the sixteenth embodiment of the present invention, wherein FIG. 18A is an assembled perspective view, and FIG. 18B is a cross-sectional view taken on line a—a in FIG. 18A;

FIGS. 19A, 19B, and 19C are views showing the seventeenth embodiment of the present invention, wherein FIG. 19A is an assembled perspective view, FIG. 19B is a cross-sectional view taken on line b—b in FIG. 19A, and FIG. 19C is a perspective view showing a variation;

FIGS. 21A, 21B, and 21C are views showing the nineteenth embodiment of the present invention, wherein FIG. 21A is a perspective view, FIG. 21B is a perspective view of the casing, and FIG. 21C is a partial cross-sectional view of FIG. 21A;

FIGS. 22A, 22B, 22C, 22D, and 22E are views showing the twentieth embodiment of the present invention, wherein FIGS. 22A to 22E are respectively views for showing a casing or heat exchanging member of the twelfth, the fourteenth, the fifteenth, the sixteen and the nineteenth embodiment;

FIGS. 25A and 25B are views showing the twenty-third embodiment of the present invention, wherein FIG. 25A is a perspective view, and FIG. 25B is a perspective view showing a state in which the cover is removed;

FIGS. 26A and 26B are views showing the twenty-fourth embodiment of the present invention, wherein FIG. 26A is a perspective view, and FIG. 26B is a schematic illustration showing a mode of operation;

FIGS. 27A and 27B are views showing the twenty-fifth embodiment of the present invention, wherein FIG. 27A is a perspective view showing a state in which the cover is removed, and FIG. 27B is a side view;

FIGS. 29A and 29B are views showing the twenty-seventh embodiment of the present invention, wherein FIG. 29A is a perspective view showing a state in which the cover is removed, and FIG. 29B is a partial enlarged view;

FIGS. 32A and 32B are views showing the thirtieth embodiment of the present invention, wherein FIG. 32A is a perspective view and FIG. 32B is a view showing a state of use of the thirtieth embodiment;

FIGS. 39A, 39B, 39C, and 39D are views showing the thirty-sixth embodiment of the present invention, wherein FIG. 39A is a perspective view, FIG. 39B is a perspective view of the fan, FIG. 39C is a cross-sectional view, and FIG. 39D is a view showing another example of the fin;

FIGS. 40A, 40B, and 40C are views showing the thirty-seventh embodiment of the present invention, wherein FIG. 40A is a perspective view of the heat sink from which the cover is removed, FIG. 40B is a plan view of the heat sink from which the cover is removed, and FIG. 40C is a view for explaining the mounting position in the apparatus;

FIGS. 41A, 41B, and 41C are views showing the thirty-eighth embodiment of the present invention, wherein FIG. 41A is a perspective view of the heat sink from which the cover is removed, FIG. 41B is a cross-sectional view taken on line b—b in FIG. 41A, and FIG. 41C is a performance curve sheet on which a relation between the height of the fin and the performance is shown;

FIGS. 44A, 44B, and 44C are views showing the forty-first embodiment of the present invention, wherein FIG. 44A is a perspective view taken from the reverse side, FIG. 44B is a cross-sectional view taken on line b—b in FIG. 44A, and FIG. 44C is a performance curve sheet showing a relation between the clearance and the performance; and FIGS. 45A and 45B are views showing the forty-second embodiment of the present invention, wherein FIG. 45A is an exploded perspective view, and FIG. 45B is also an exploded perspective view.

DESCRIPTION OF THE PREFERRED EMBODIMENTS

Figure 1A:
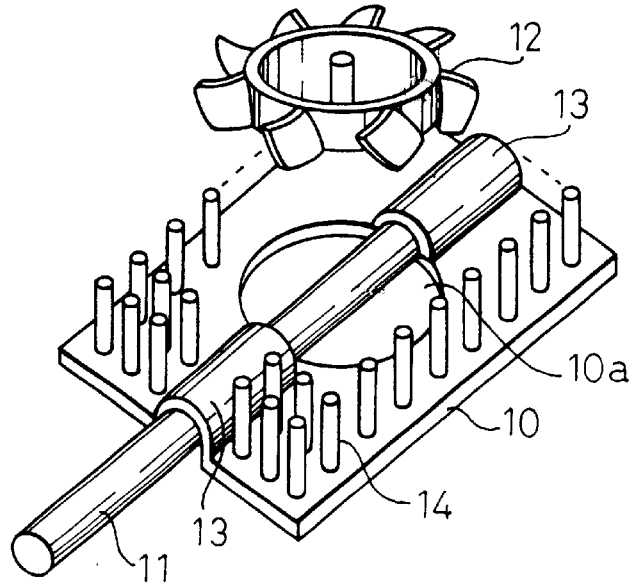
Figure 1B:
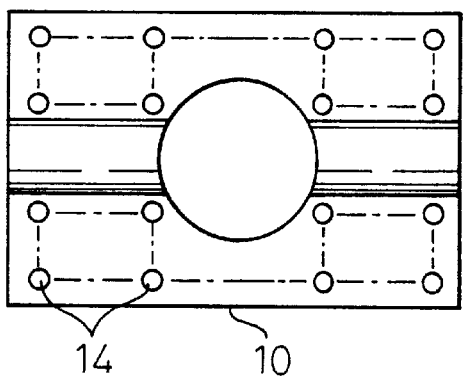
Figure 1D:
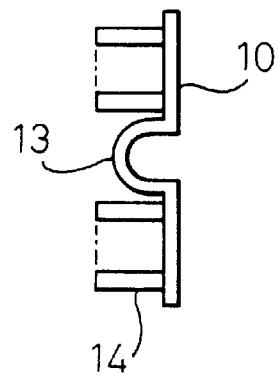
Figure 1C:
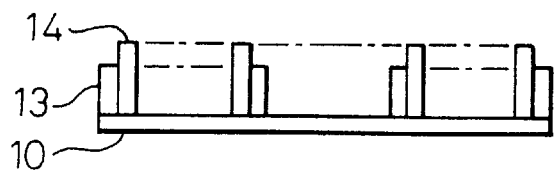

FIGS. 1A–1D are views showing the first embodiment of the present invention. FIG. 1A is a perspective view, FIG. 1B is an upper view, FIG. 1C is a front view, and FIG. 1D is a side view. In these figures, reference numeral 10 is a heat sink body, reference numeral 11 is a heat pipe corresponding to the heat transmitting member described in the scope of claim of the patent, and reference numeral 12 is a cooling fan. The heat sink body is formed into a rectangular plate shape. There is provided a cooling fan 12 above the heat sink body 10. The cooling fan 12 is embedded in a space 10a under the condition that a shaft of the cooling fan 12 is supported by a cover mounted on the heat sink body 10. There is provided a tunnel-shaped heat pipe accommodating section 13 into which a heat pipe 11 is inserted while the heat pipe 11 crosses two sides of the heat sink body 10 which are opposed to each other. This heat pipe accommodating section 13 corresponds to the holding section described in the scope of claim of the patent.

A portion of the heat pipe accommodating section 13 located below the space 10a in which the heat sink body 10 is embedded is partially cut away so that the heat pipe 11 can be exposed. On the surface of the heat sink body except for the cutaway portion and the space 10a in which the cooling fan 12 is embedded, there are provided a large number of fins 14 which are attached perpendicularly onto the heat sink body 10.

Since a portion of the tunnel-shaped heat pipe accommodating section is partially cut away, it is possible to embed the cooling fan in the heat sink body 10 more deeply by the thickness of the cutaway portion. In the conventional heat sink, the aforementioned thickness of the heat pipe accommodating section 13 prevents the cooling fan to be embedded deeply. Therefore, it is difficult to actually mount the heat sink in which the cooling fan is embedded. However, according to the present invention in which the cooling fan can be embedded in the heat sink more deeply, by cutting the fin portions protruding from the surface of the cooling fan, the thickness of the heat sink can be reduced. Therefore, it is possible to meet the requirements of the standard of the apparatus.

The heat pipe 11 is connected with heating parts such as MPU and a hard disk. This connection is performed as follows. A plate made of metal, the heat conductivity of which is high, the shape of which corresponds to the radiating shape of the heating component, is connected to the heat pipe 11, and the heat generated by the heating component is transmitted to the heat pipe 11 via the plate. The heating component and the heat sink are mounted on the printed board at positions distant from each other. When the heat sink is mounted at a position distant from the heating component, the degree of freedom of the mounting positions can be enhanced. Heat generated by the heating component is transmitted to the heat sink via the heat pipe 11. When the cooling fan 12 is driven, a wind sent from the cooling fan 12 cools the heat sink body 10 and the fins 14, and at the same time, it is possible to directly blow the wind of the cooling fan 12 against the heat pipe 11 exposed from the heat pipe accommodating section 13. Further, it is possible to have a heat radiation from the heat pipe 11 which connects the heating component with the heat sink. In this way, the heating component can be effectively cooled.

In this connection, examples of a highly conductive material composing the heat sink body 10 are: plastics such as resin, the brand name of which is Amoco Xydar manufactured by Wake Field Engineering Co., into which carbon fibers are mixed, which is formed into the heat sink body 10 by means of injection molding; and metal such as aluminum which is formed into the heat sink body 10 by means of die cast or extrusion. In the drawing, the shape of the fin 14 is a circular cylinder, however, it may be a prism or other shapes.

Figure 2:
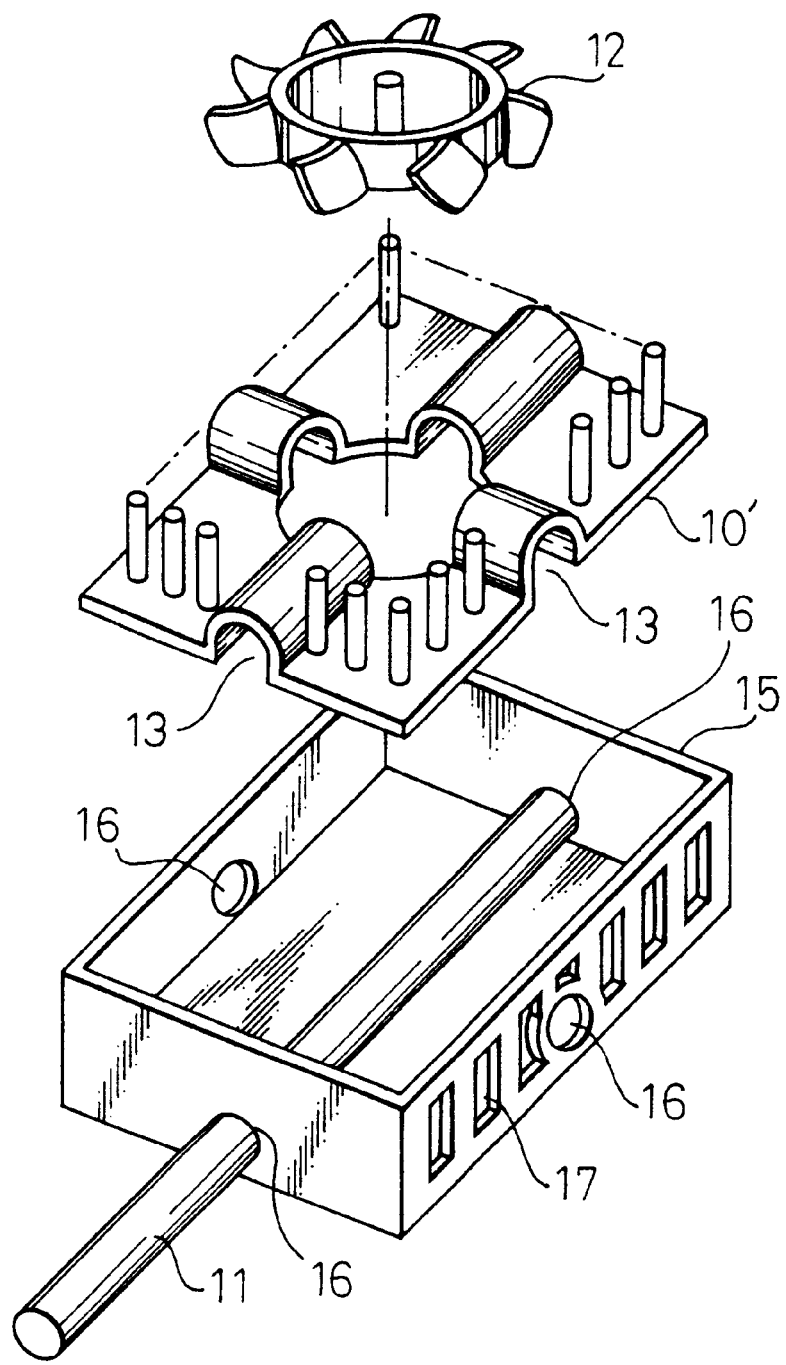
FIG. 2 is an exploded perspective view showing the second embodiment of the present invention.

FIG. 2 is a perspective view showing the second embodiment of the present invention. In this second embodiment, on the opposed sides of the box 15 made of good conductive material or good conductive resin, there are provided holes 16 into which the heat pipe is inserted, and slits 17 through which a wind sent from the cooling fan 12 is sucked or discharged. The box 15 accommodates the heat sink body 10 of the first embodiment described before and holds the heat pipe 11.

In this connection, as shown in FIG. 2, in the heat sink 10' accommodated in the box 15, there is provided a cross-shaped heat pipe accommodating section 13. It is possible to attach a cross-shaped heat pipe 11 to the heat sink body 10' using this cross-shaped heat pipe accommodating section 13. In this case, it is necessary to form the holes 16 for accommodating the cross-shaped heat pipe 11 on the opposed sides of the box 15. In the heat sink 10', in the same manner as that of the first embodiment, there is provided a space 10'a, in which the cooling fan 12 is embedded, in a portion where the heat pipe 11 crosses. It is necessary to partially cut away a portion of the heat pipe accommodating section 13 below the cooling fan 12 where the heat pipe accommodating section 13 crosses.

When the box 15 is made of metal, the method of sheet metal forming or bending is used. When the box 15 is made of resin, the method of injection molding is used. The heat pipe 11 is positively held by the method of press-fitting, crimping or adhesion. When the heat pipe 11 is held by the mechanical method of crimping or adhesion, it is preferable that thermal grease is charged into a gap formed between the heat pipe and the heat sink body and also it is preferable that thermal grease is charged into gaps formed in the box. The shape of the slit 17 through which a wind of the cooling fan 12 is sucked and discharged is formed into a shape by which a high cooling performance or low noise can be provided. The slits 17 may be formed on one side or two to four sides of the box.

When the heat sink body 10 is accommodated in the box 15, it is possible for a designer to design the heat sink as one unit. Accordingly, he can design the layout of the apparatus easily. When the slits 17 are provided on the sides of the box 15, it is possible to intentionally send a cooling wind to other heating components arranged in the periphery of the heat sink. Accordingly, the cooling efficiency of the entire apparatus can be enhanced.

Figure 3A:
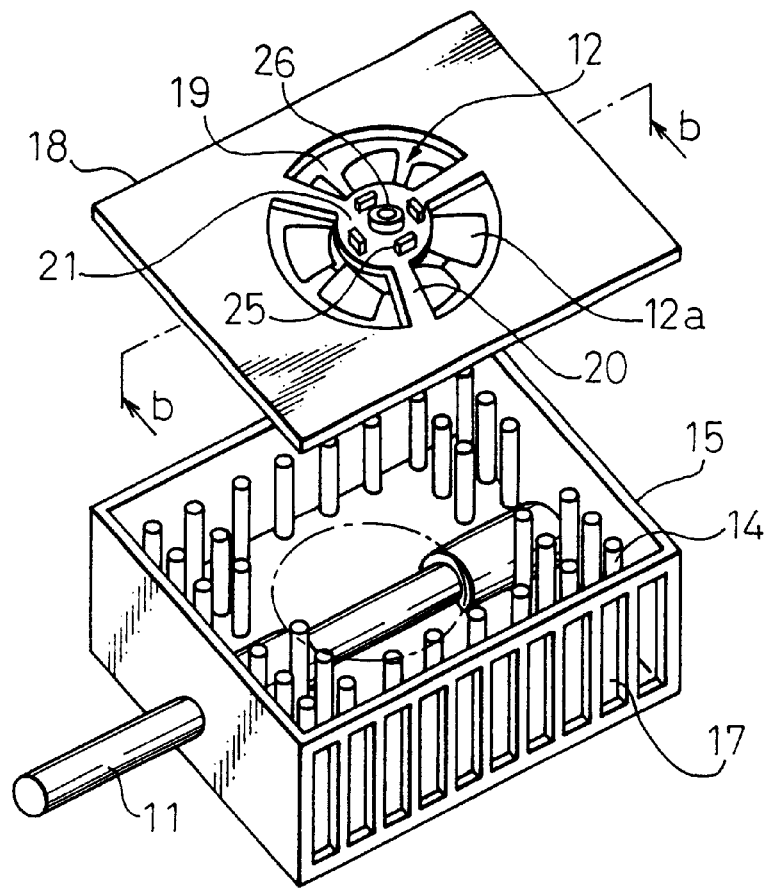
Figure 3B:
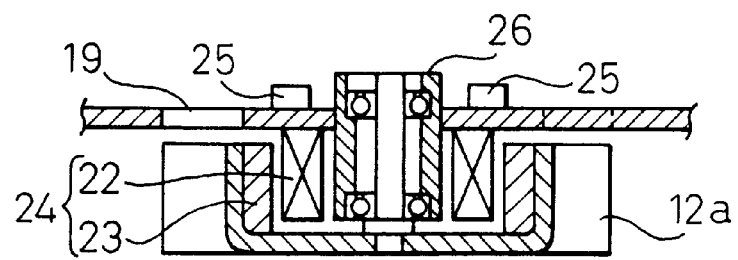

FIGS. 3A and 3B are views showing the third embodiment of the present invention. FIG. 3A is a perspective view, and FIG. 3B is a cross-sectional view taken on line b—b in FIG. 3A. In the first embodiment described before, the cooling fan 12 is supported by the cover. However, in the third embodiment, the printed board for driving the fan motor, which is originally incorporated into the cooling fan 12, is arranged outside the cooling fan 12, and the cooling fan 12 is supported on this printed board 18.

The printed board 18 is composed as follows. On the printed board 18, there are provided ventilation holes 19, in which a cooling wind flows, along the circumference of the blades 12a. A portion of the printed board 18, that is, an island-shaped portion 21 is left inside being supported by ribs 20, the number of which is not less than two. On the upper surface of the island-shaped portion 21, a portion 24 of the drive circuit of the fan motor 24 and a bearing housing 25 are held. On the lower surface, a coil 22 and a magnet 23 of the fan motor 24 are supported.

In the third embodiment, the printed board is also used as a cover to support the cooling fan 12. Therefore, it is possible to ignore a space in the cooling fan in which the printed board is conventionally arranged. Consequently, it is possible to reduce the thickness of the heat sink including the cooling fan.

When only the cooling fan 12 is supported on the printed board 18, which is also used as a cover, an empty space is generated. In order to utilize the empty space, a portion of the drive circuit, which is conventionally mounted in the fan motor, can be arranged on the upper surface of the printed board. When the fan motor drive circuit is arranged being separated into the fan motor and onto the printed board, the thickness of the cooling fan can be reduced. In this connection, this printed board is also used as an upper lid of the box 15 in which the heat sink body is accommodated.

Figure 4:
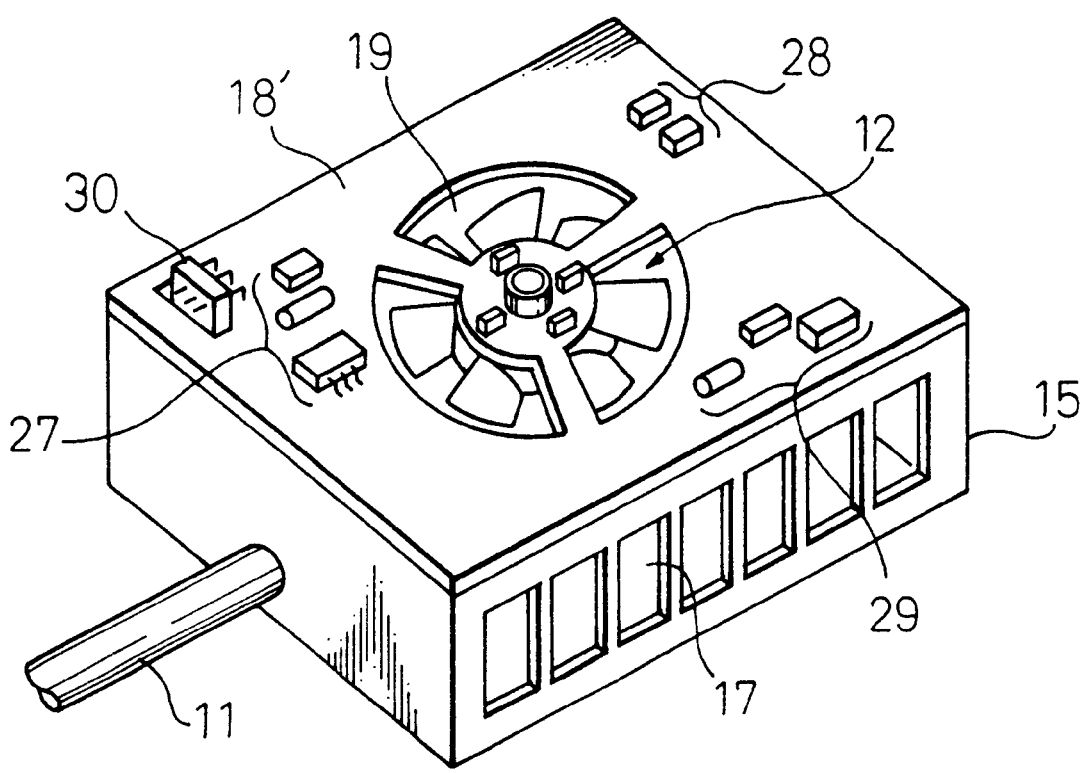
FIG. 4 is a view showing the fourth embodiment of the present invention.

FIG. 4 is a perspective view showing the fourth embodiment of the present invention. In this fourth embodiment,
when there is an empty space on the printed board 18', on the upper surface of which a portion of the fan motor drive circuit is mounted, a portion of the cooling fan drive circuit 27 and various control circuit 28 for the cooling fan can be arranged in the empty space. When there is provided a further empty space, a circuit 29 of the objective apparatus to be cooled, a power source to drive the cooling fan and a connector 30 for the control signal may be arranged in the empty space. These circuits are originally mounted on the mother board. Therefore, when these circuits are arranged on the printed board 18', the dimensions of the mother board can be reduced accordingly. Accordingly, it is possible to expect a reduction in the size of the apparatus.

Figure 5:
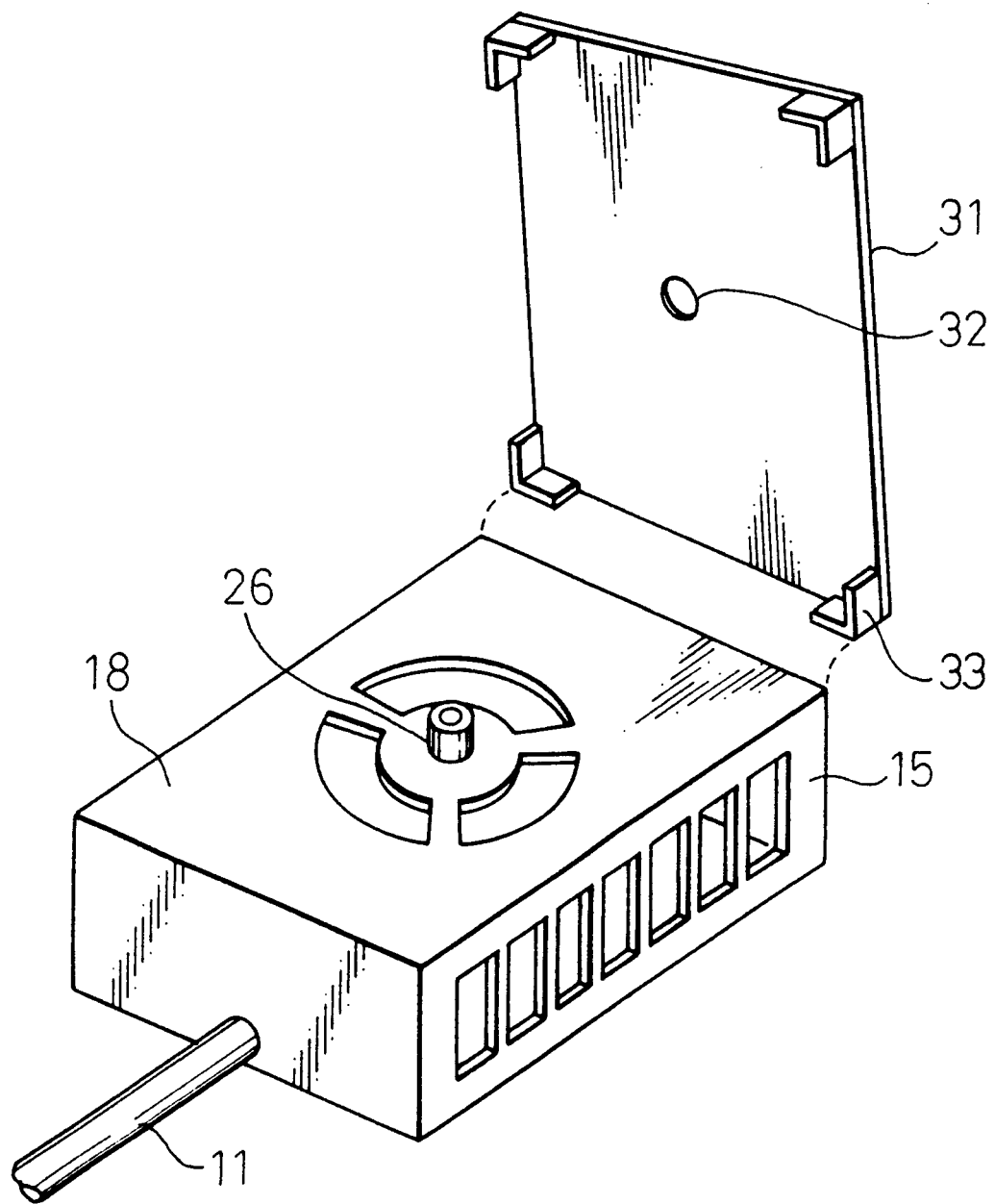
FIG. 5 is a view showing the fifth embodiment of the present invention.

FIG. 5 is a perspective view showing the fifth embodiment of the present invention. In this fifth embodiment, there is provided a cover 31 on the printed board 18 in the third embodiment of the invention shown in FIGS. 3A and 3B. This cover 31 is provided to protect various circuit parts mounted on the printed board 18. This cover 31 is made of plastics, or a metallic sheet on the surface of which insulation processing is conducted. Alternatively, this cover 31 is made by means of die casting and an insulating process is conducted on the surface. On the cover 31, there is provided a hole 32 to strongly support the bearing housing 26 which is supported by the printed board 18. In order to ensure an air gap used for sucking and discharging a wind sent from the cooling fan 12, spacers 33 are arranged at the four corners of the cover 31.

These spacers 33 are fixed onto the upper surface of the printed board 18, for example, by an adhesive agent. In this case, the height of the spacer 33 is the same as the height of the air gap. In the case of incorporating the heat sink into the apparatus, even if many other parts are arranged in the periphery of the heat sink for the reasons of reducing the dimensions of the apparatus and increasing the density of mounted parts, when this air gap is ensured in the manner described above, the cooling fan 12 can sufficiently suck and discharge air through the gap. In this connection, the protruding length of the bearing housing 26 supported by the hole 32 formed on the cover 31 is larger than this air gap.

Figure 6:
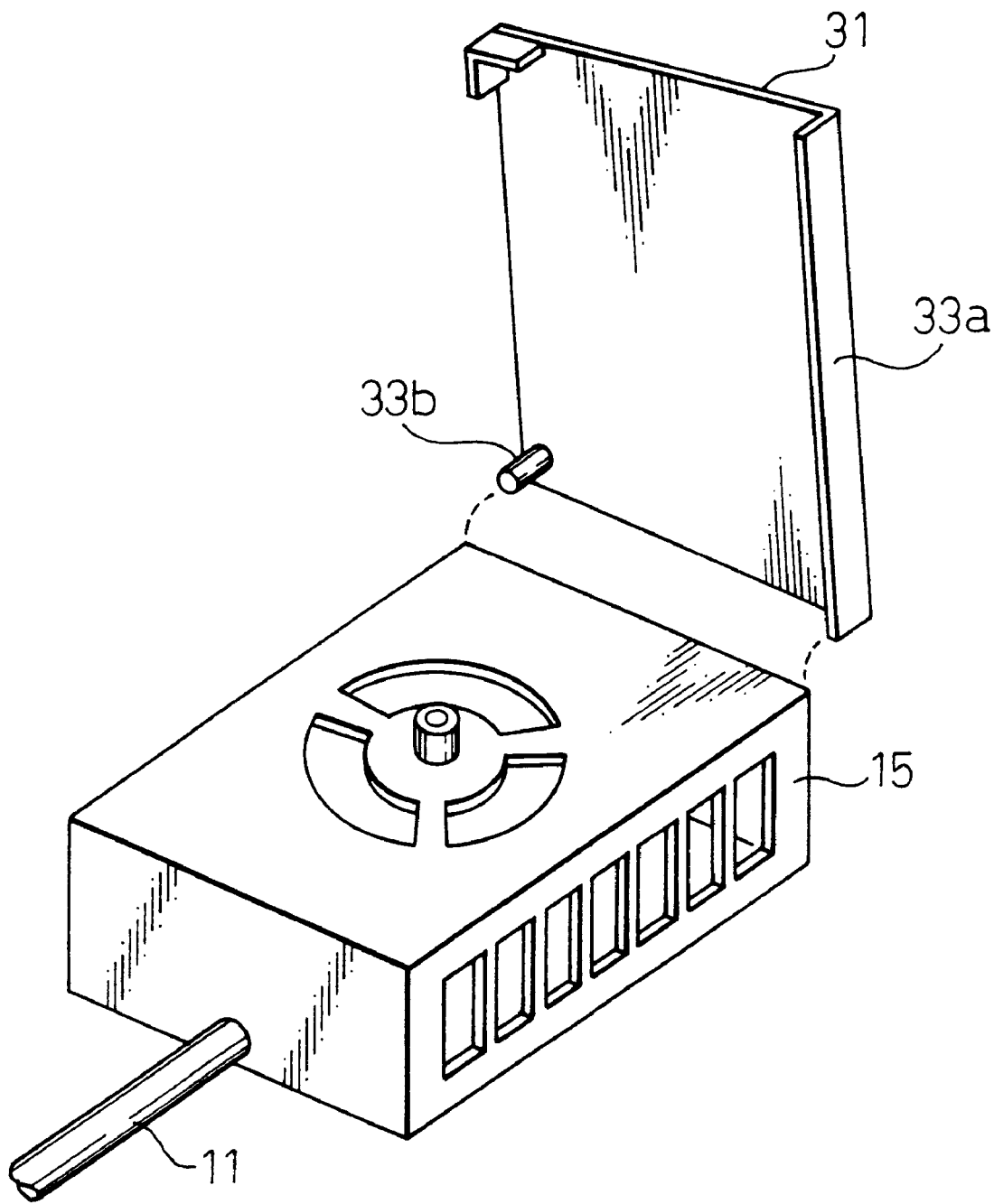
FIG. 6 is a view showing the sixth embodiment of the present invention.

FIG. 6 is a perspective view showing the sixth embodiment of the present invention. This sixth embodiment is a variation of the shape of the spacer in the fifth embodiment. In this sixth embodiment, there are provided a bent section 33a and a circular cylinder 33b. When the bent section 33a is formed, it possible to provide a directivity when air is sucked or discharged by the cooling fan 12. That is, when a wall corresponding to the wall of the box 15 on which the slits 17 are formed is closed by the bent section 33a, it is possible to shift the suction side and the discharge side.

Figure 7:
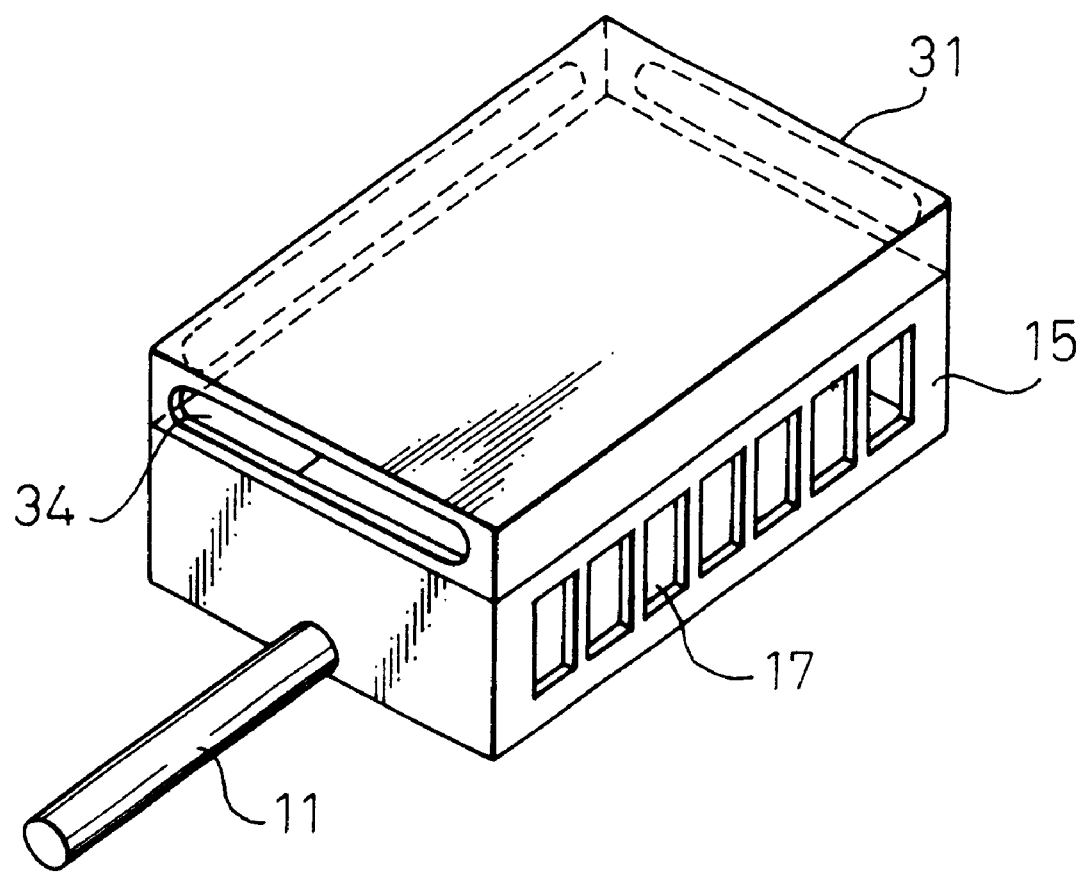
FIG. 7 is a view showing the seventh embodiment of the present invention.

FIG. 7 is a perspective view showing the seventh embodiment of the present invention. In this embodiment, the box-shaped cover 31 is attached onto the printed board 18 in such a manner that the box-shaped cover 31 is laid upside down on the printed board 18. There is formed a long hole 34 on at least one side which is different from the side of the box 15 on which the slits 17 are formed. When the surface on which the slits 17 are formed and the surface on which the long hole 34 is formed are shifted from each other, it is possible to shift the suction side and the discharge side. Therefore, the cooling air can be prevented from going round.

Figure 8A:
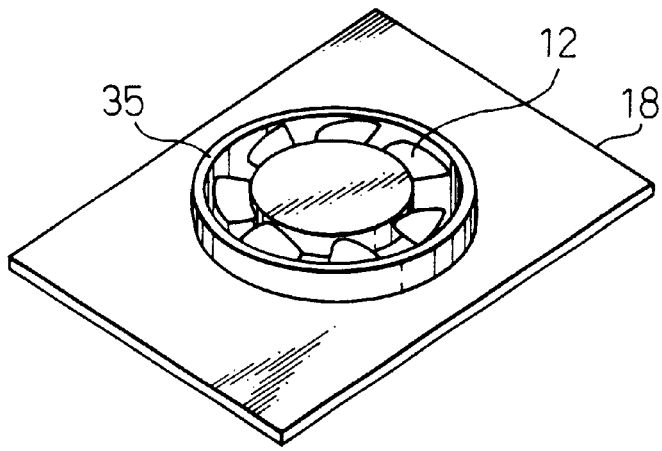
Figures 8B, 8C:
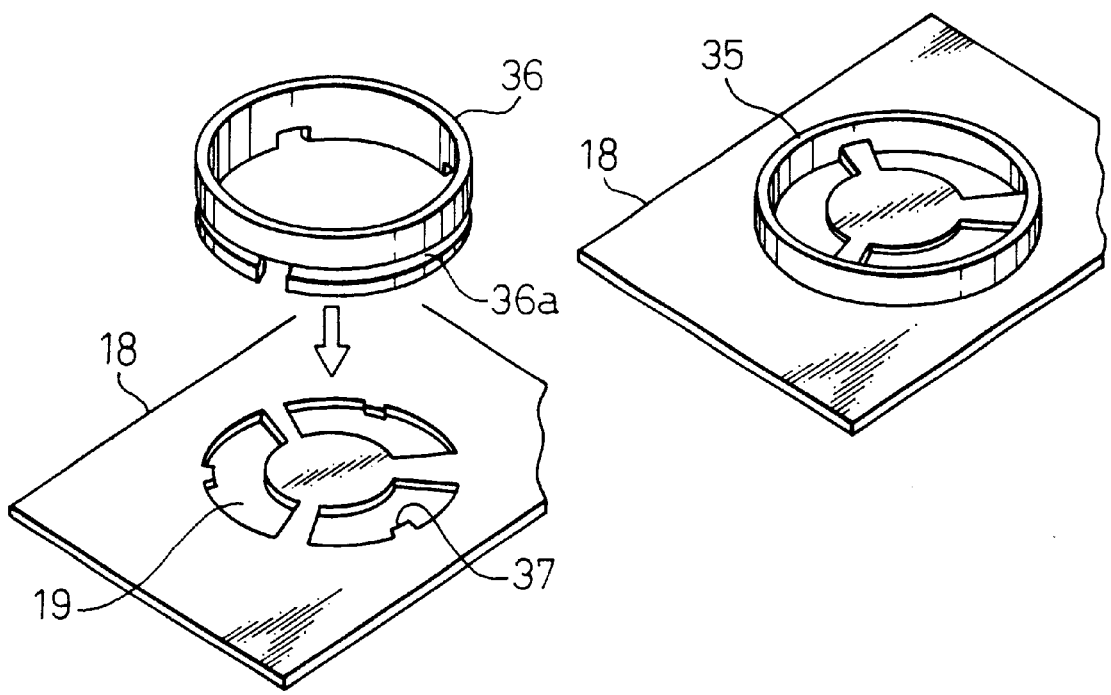

FIGS. 8A–8C are views showing the eighth embodiment of the present invention. FIG. 8A is an assembled perspective view, FIG. 8B is an exploded perspective view, and FIG. 8C is a perspective view showing another example of the venturi. There is provided a venturi 35 along the circumference, in the depth direction, of the blades of the cooling fan 12 supported by the printed board 18, in such a manner that the venturi 35 surrounds the blades. This venturi 35 is provided for increasing the static pressure of the cooling fan 12. This venturi 35 regulates the flow of the air, so that the cooling fan can be effectively driven.

The venturi 35 is composed in such a manner that a plurality of protrusions 37 provided inside the ventilation hole 19 formed on the printed circuit 18 are engaged with a groove 36a formed on the ring 36. In this connection, the venturi 35 is defined as a portion inside the ring 36 on the blade side located on the circumference of the blades in the depth direction. As another means for composing the venturi, the ring 36 may be integrated with the printed board 18.

Figure 9A:
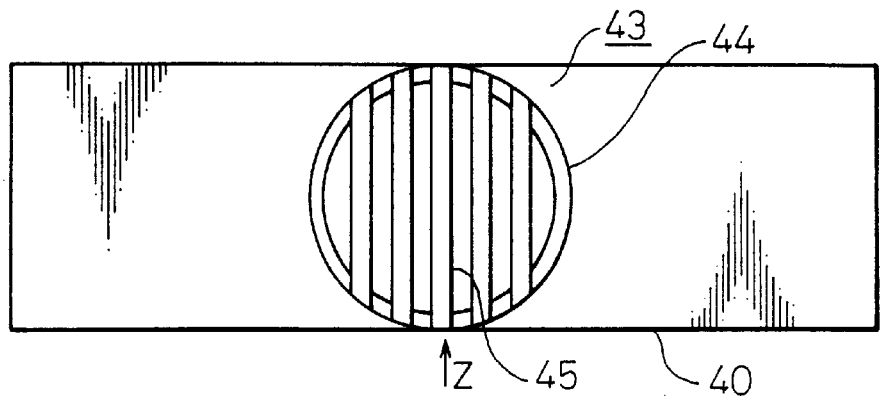
Figure 9B:
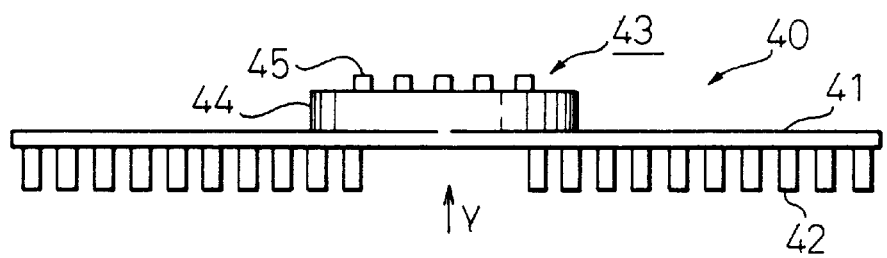
Figure 9C:
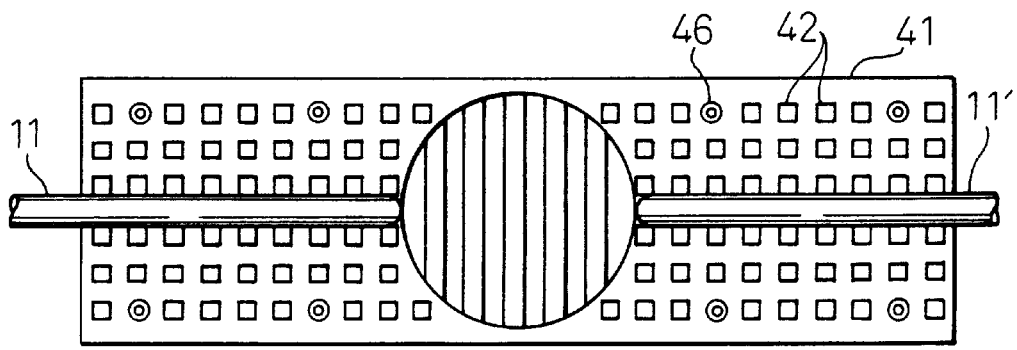

FIGS. 9A~9C and 10A~10D are views showing the ninth embodiment of the present invention. FIGS. 9A~9C are views showing a heat sink body. FIG. 9A is a front view, FIG. 9B is a view taken in the direction of arrow Z in FIG. 9A, and FIG. 9C is a view taken in the direction of arrow Y in FIG. 9B. FIGS. 10A~10D are views showing a cover. FIG. 10A is an upper view, FIG. 10B is a front view, FIG. 10C is a side view, and FIG. 10D is an assembled perspective view.

The ninth embodiment is composed of a heat sink body 40 and a cover 47. The heat sink body 40 is composed in such a manner that a large number of prism-shaped fins 42 are perpendicularly arranged on a rectangular-plate-shaped heat sink base 41 made of good conductive material such as aluminum or resin, the conductivity of which is high, such as resin, the brand name of which is Amoco Xydar manufactured by Wake Field Engineering Co., into which carbon fibers are mixed. At the center of the heat sink body 40, there is provided a space in which the cooling fan is embedded. Corresponding to this space, there is provided a venturi 44 in such a manner that the venturi 44 surrounds the circumference of the cooling fan in the direction of the depth of the blades. At the end of the venturi 44, there is formed a ventilation hole for the cooling fan, and also there are formed rod-shaped fins 45 which partially close the ventilation hole at predetermined intervals.

As shown in FIG. 9C, the heat pipe 11 is inserted into among the fins 42 and held by the heat sink base 41. In this example, two heat pipes 11 are inserted from both sides and butted to each other and supported. In this connection, on the heat sink base 41, there are provided a plurality of screw holes 46 used for the connection with the cover.

The cover 47 is made of the same material as that of the heat sink base. As shown in FIGS. 10A 10D, the cross-section of the cover 47 is formed into a C-shape so that it can cover the back of the heat sink base 41. In a portion of the cover 47 corresponding to the position at which the cooling fan is embedded in the heat sink body 40, there are provided ventilation holes 48 and a fan fixing section 49 in which the cooling fan is fixed. On the cover 47, there are provided a plurality of connection holes 50 corresponding to the screw holes 46 on the heat sink base 41. As shown in FIG. 10D, the cover 47 is combined with the heat sink body 40 by screws 51.

Figure 11:
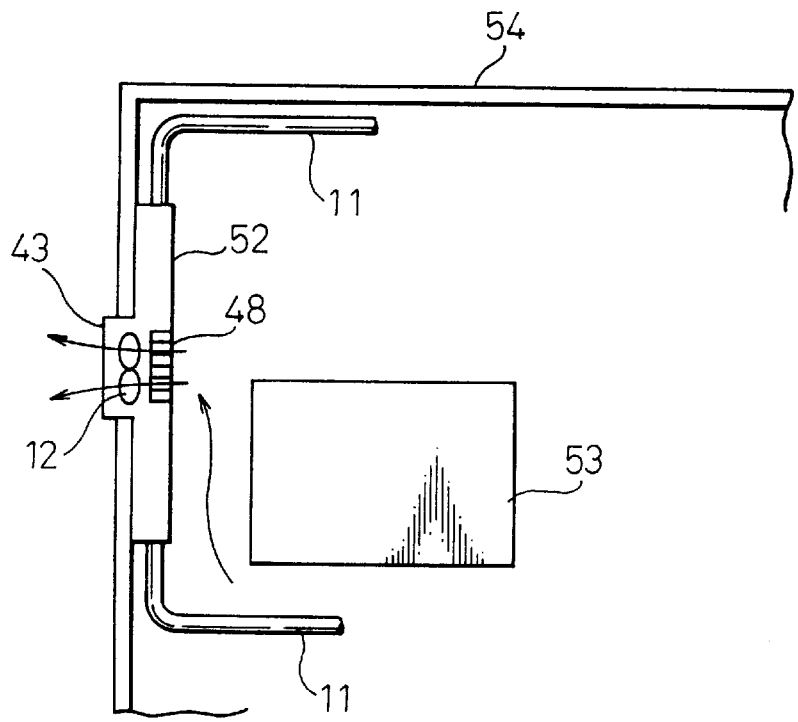
FIG. 11 is a view showing a state of use of the ninth embodiment of the present invention.

The heat sink 52 composed in the manner shown in FIG. 10D is arranged at a position shown in FIG. 11. That is, the heat sink 52 is arranged in the frame (on the side wall) of the casing 54 of a note book type computer so that an auxiliary heat sink 43 can be exposed. When the cooling fan is embedded in the heat sink, the auxiliary heat sink 43 protrudes outside the casing. The heat sink is accommodated in such a manner that this protruding height of the auxiliary heat sink 43 overlaps the thickness of the frame. Therefore, it is not necessary to mount the heat sink at a position above the heating component or in the periphery of the heating component, that is, the mounting position of the heat sink is not particularly limited. Accordingly, the heat sink can be mounted at an arbitrary position in accordance with the layout of the mounted parts. As described above, the degree of freedom of mounting the heat sink can be enhanced, and the dimensions of the apparatus can be reduced.

Two heat pipes 11 are connected with the heat sink 52. The respective ends of these heat pipes 11 are connected with the heating component via the plate, the heat conductivity of which is high, so that heat generated by the heating component is transmitted to the heat sink 52 via the heat pipes 11. The heat pipes 11 are connected with the heating components such as a microprocessor and a hard disk. It is possible to connect the heat pipes in such a manner that some heat pipes are connected with the microprocessor and other heat pipes are connected with the hard disk.

In the heat sink 52 shown in FIG. 11, when the cooling fan 12 is driven, air is sucked from the ventilation holes 48 formed on the rear surface of the heat sink 52, that is, air is sucked from the ventilation holes 48 formed on the surface of the heating component side. Therefore, heat conducted by the heat pipes 11 can be removed by the heat sink 52. When the cooling wind flows into the ventilation holes 48 of the heat sink 52, the heating unit 53 and other heating parts, which are mounted in the middle of the wind passage in the apparatus, can be also air-cooled. In this case, only one set of fans can cool both the inside of the apparatus and the heat sink 52. Accordingly, the dimensions of the apparatus can be further reduced.

Figure 12:
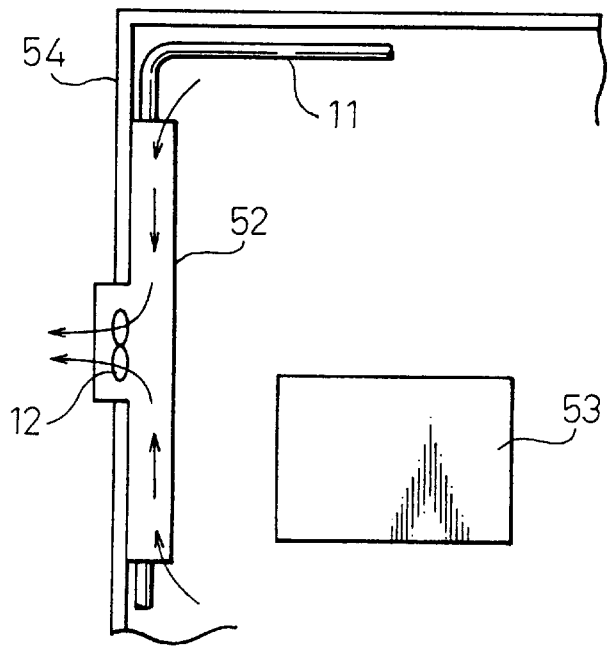
FIG. 12 is a view showing the tenth embodiment of the present invention.

FIG. 12 is a view showing the tenth embodiment of the present invention. On the rear surface of this heat sink 52, that is, on the surface of this heat sink 52 on the side of the heating component, there are provided no ventilation holes 48. In this embodiment, air is sucked from both ends of the heat sink 52 into which the heat pipes 11 are inserted. However, in the case where air is sucked from both ends of the heat sink 52, a heavy load is given to the flow of the air by the fins arranged in the heat sink 52. Accordingly, it is necessary to reduce the number of fins so as to lighten the load given to the flow of the air by the fins.

Figure 13A:
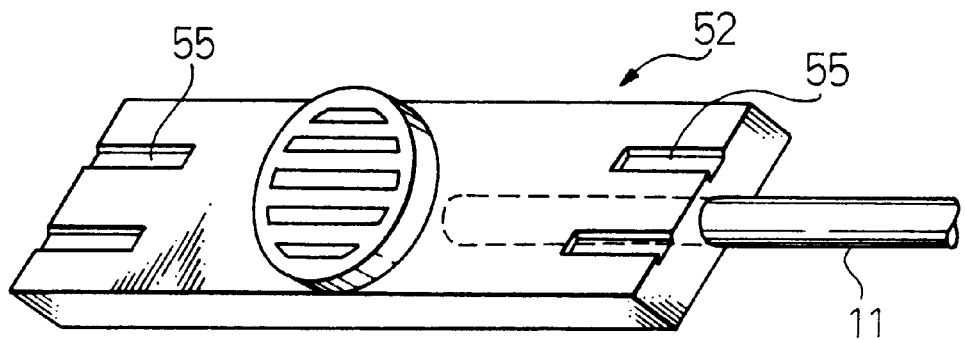
Figure 13B:
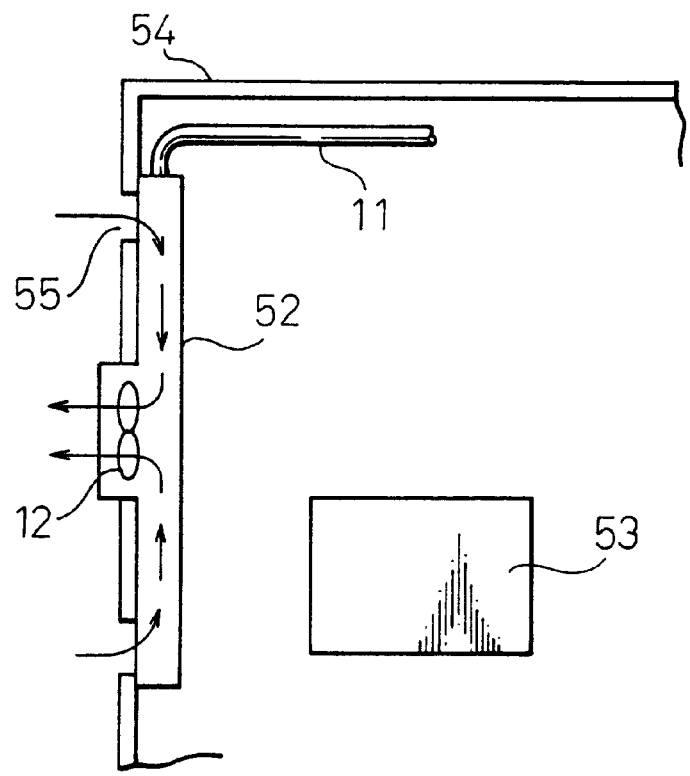

FIGS. 13A and 13B are views showing the eleventh embodiment of the present invention. FIG. 13A is an assembled perspective view, and FIG. 13B is a view showing a state in which the heat sink is used. In the eleventh embodiment, on the right and left of the front portion of the heat sink body 41, there are provided ventilation holes 55, and at positions corresponding to these ventilation holes 55, that is, at positions of the frame which comes into contact with the ventilations holes 55 when the heat sink 52 is embedded in the frame, there are provided suction holes from which air can be sucked into the heat sink body. Consequently, fresh air can be always taken in from the outside into the heat sink 52, and the cooling efficiency can be enhanced.

Figure 14A:
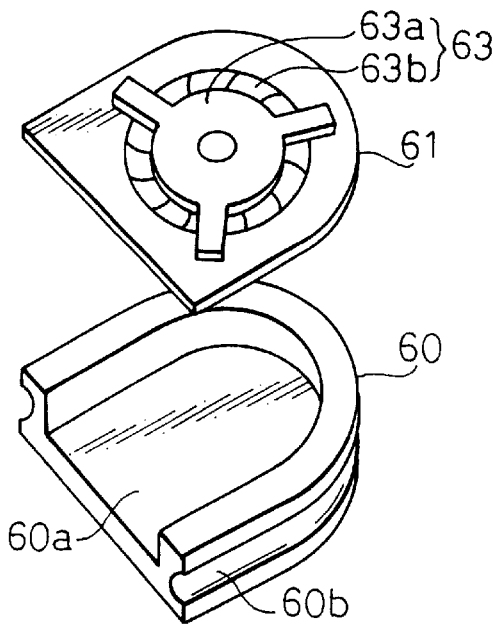
Figure 14C:
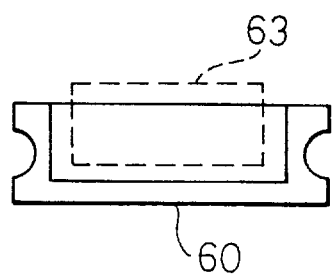
Figure 14B:
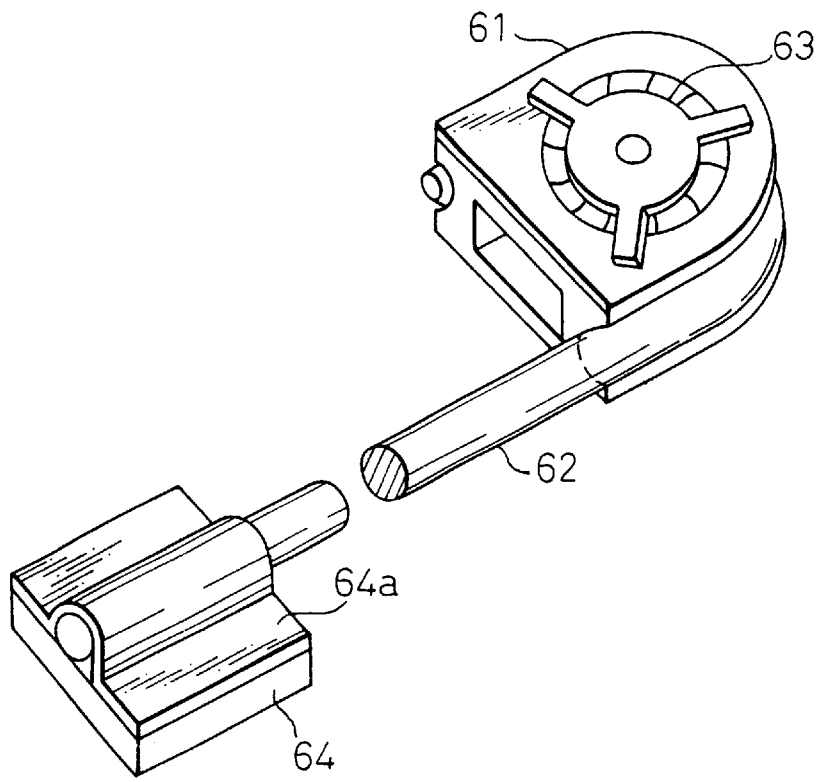

FIGS. 14A~14C are views showing the twelfth embodiment of the present invention. FIG. 14A is an exploded perspective view, FIG. 14B is a view showing a state in which the heat sink is used, and FIG. 14C is an assembled cross-sectional view. The twelfth embodiment is composed of a casing 60, cover 61 and heat conveyance member 62. The casing 60 is made of highly conductive material such as aluminum or aluminum alloy by means of die cast or cold forging, or alternatively the casing 60 is formed by means of sheet metal forming or alternatively the casing 60 is made of resin, the heat conductivity of which is high. Inside the casing 60, there is provided a space 60a used for ventilation, and on the c-shaped outer circumference wall of the casing 60, there is provided a groove 60b in which the heat conveyance member 62 is accommodated.

The cover 61 has a centrifugal fan 63 composed of a drive motor 63a and blades 63b. This cover 61 is attached to the casing 60 by means of screwing or caulking. The heat conveyance member 62 is made of a highly conductive metal such as copper, or a heat pipe is used for the heat conveyance member 62. The heat conveyance member 62 is press-fitted into the groove 60b of the casing, or alternatively the heat conveyance member 62 is made to adhere by an adhesive agent, the heat conductivity of which is high. In this connection, when the heat conveyance member 62 is press-fitted into the groove 60b of the casing, a gap between the heat conveyance member 62 and the groove 60b may be filled with thermal grease.

One end of the heat conveyance member 62 is fixed to the heating component such as MPU via an aluminum plate 64a by means of adhesion or caulking. In this embodiment, composed as described above, air is sucked from the upper portion and discharged from the side. Therefore, it is possible to extend the heat exchanging area in which heat is exchanged with air in the casing section 60 in which the air pressure is high. Accordingly, the cooling performance can be enhanced.

Figure 15A:
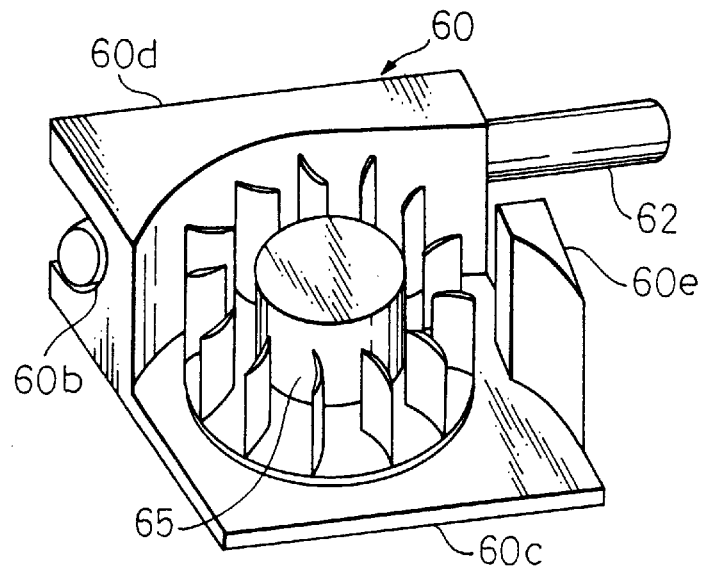
Figure 15B:
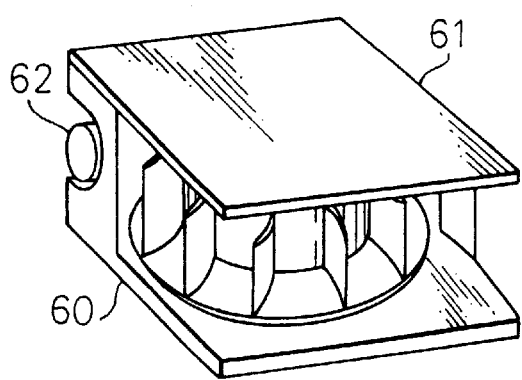
Figure 15C:
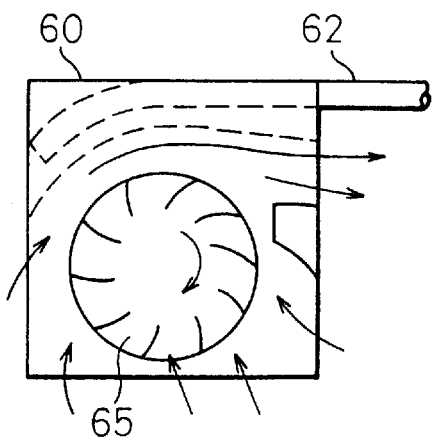

FIGS. 15A~15C are views showing the thirteenth embodiment of the present invention. FIG. 15A is a perspective view showing a state in which the cover is removed, FIG. 15B is an assembled perspective view, and FIG. 15C is a schematic illustration showing a mode of operation. The heat sink of the thirteenth embodiment of the invention includes: a casing 60, cross flow fan 65, cover 61 and heat conveyance member 62. The casing 60 is made of a metal, the heat conductivity of which is high, such as aluminum or aluminum alloy by means of die cast or cold forging, or alternatively made of a resin, the heat conductivity of which is high. On one side of the base 60c holding the cross flow fan 65, there is perpendicularly arranged a wall body 60d, the surface of which is curved along the cross flow fan 65. Outside the wall body 60d, there is provided a groove 60b for accommodating the heat conveyance member 62. The heat conveyance member 62 is press-fitted into the groove 60b. Alternatively, the heat conveyance member 62 is made to adhere into the groove 60b by an adhesive agent. In this connection, reference numeral 60e is a guide used for ventilation.

As shown in FIG. 15C, the cross flow fan 65 sucks air from the three surfaces and discharges it from one of the three surfaces. As described above, in this embodiment, air can be sucked and discharged from the side of the fan. Accordingly, the thickness of the fan can be reduced, and the same effect as that of the embodiment described before can be provided.

Figure 16A:
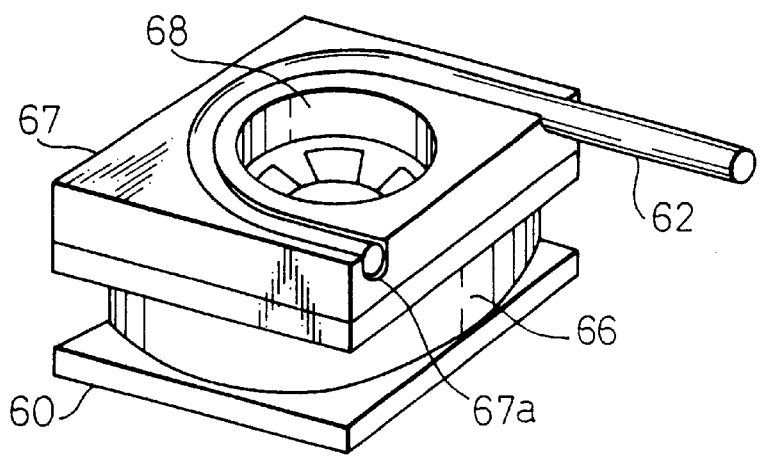
Figure 16B:
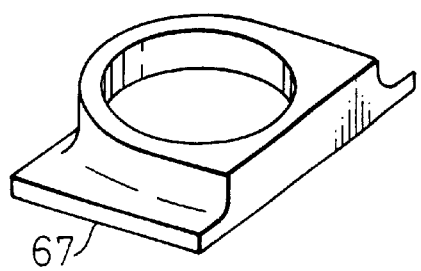
Figure 16C:
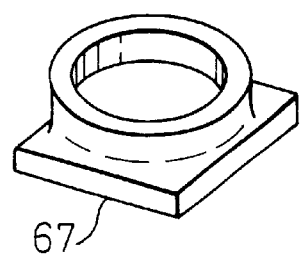
Figure 16D:
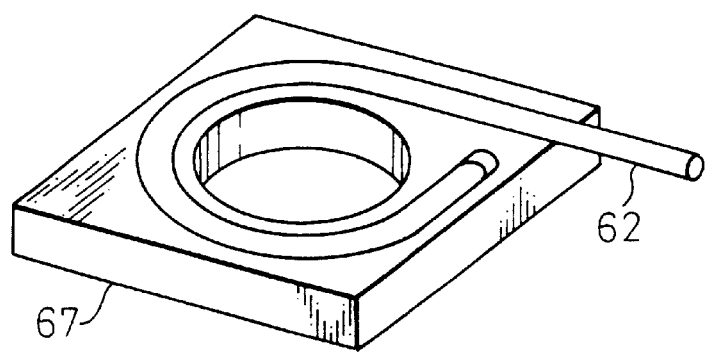

FIGS. 16A~16D are views showing the fourteenth embodiment of the present invention. FIG. 16A is an assembled perspective view, and FIGS. 16B to 16D are views showing a variation of the heat sink shown in FIG. 16A. The heat sink of the fourteenth embodiment includes: an axial blower 66 having a casing 60; a heat exchanging section 67 arranged on the casing 60; and a heat conveyance member 62. The casing 60 and the heat exchanging section 67 are made of a metal, the heat conductivity of which is high, such as aluminum or aluminum alloy by means of die cast or cold forging, or alternatively made of a resin, the heat conductivity of which is high. The heat exchanging section 67 is composed as follows. There is provided a ventilation passage 68 in the height direction of the fan 66. In the periphery of the ventilation passage 68, there is formed a groove 67a for accommodating a heat conveyance member 62. Into this groove 67a, the heat conveyance member 62 is press-fitted or made to adhere by a heat conductive adhesive agent.

In this connection, as shown in FIGS. 16B and 16C, the outer periphery of the heat exchanging section 67 may be cut away so as to reduce the dimensions, or alternatively as shown in FIG. 16D, the heat conveyance member 63 may be arranged round the ventilation hole 68. According to the heat sink of this embodiment composed as described above, since the ventilation passage is arranged in the heat exchanging section 67, it is possible to minimize a decrease in the air-flow efficiency, and also it is possible to exhaust air from the apparatus and radiate heat generated by the heat conveyance member 62. Consequently, the cooling efficiency of the apparatus can be enhanced.

Figure 17A:
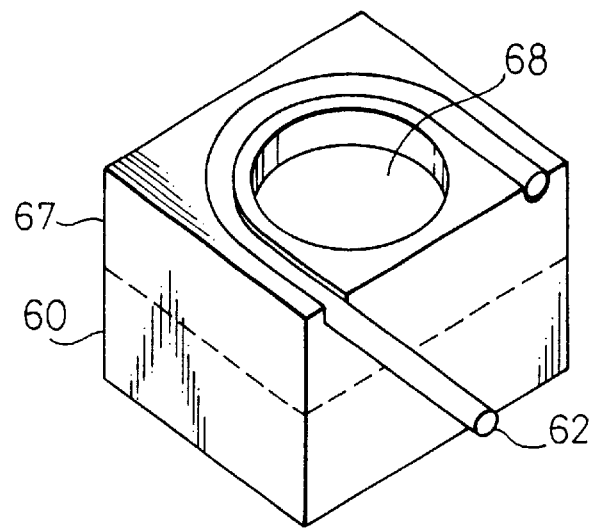
Figure 17B:
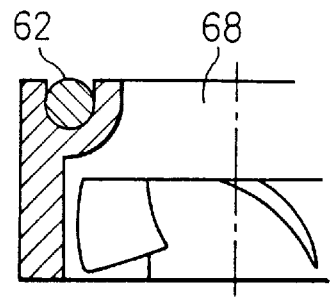
Figure 17C:
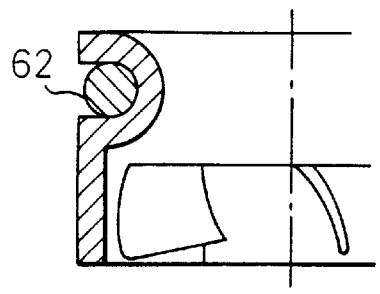

FIGS. 17A~17C are views showing the fifteenth embodiment of the present invention. FIG. 17A is an assembled perspective view, FIG. 17B is a cross-sectional view of FIG. 17A, and FIG. 17C is a view showing a variation of the heat sink shown in FIG. 17A. The heat sink of this fifteenth embodiment is composed as follows. The heat exchanging section 67 is formed by extending the casing 60 of the axial blower 66 in the height direction. As shown in FIGS. 17B and 17C, on the upper surface or the side of this heat exchanging section 67, a groove is formed along the outer circumference of the ventilation passage 68. The heat conveyance member 62 is press-fitted into this groove or made to adhere to this groove by a heat conductive adhesive agent. In this connection, the casing 60 and the heat exchanging section 67 are made of the same material as that of the embodiment described before. In the heat sink of this embodiment composed as described above, the heat exchanging section 67 is integrated with the casing 60 of the fan. Accordingly, there is no contact heat resistance in this heat sink, and the cooling efficiency can be enhanced.

Figure 18A:
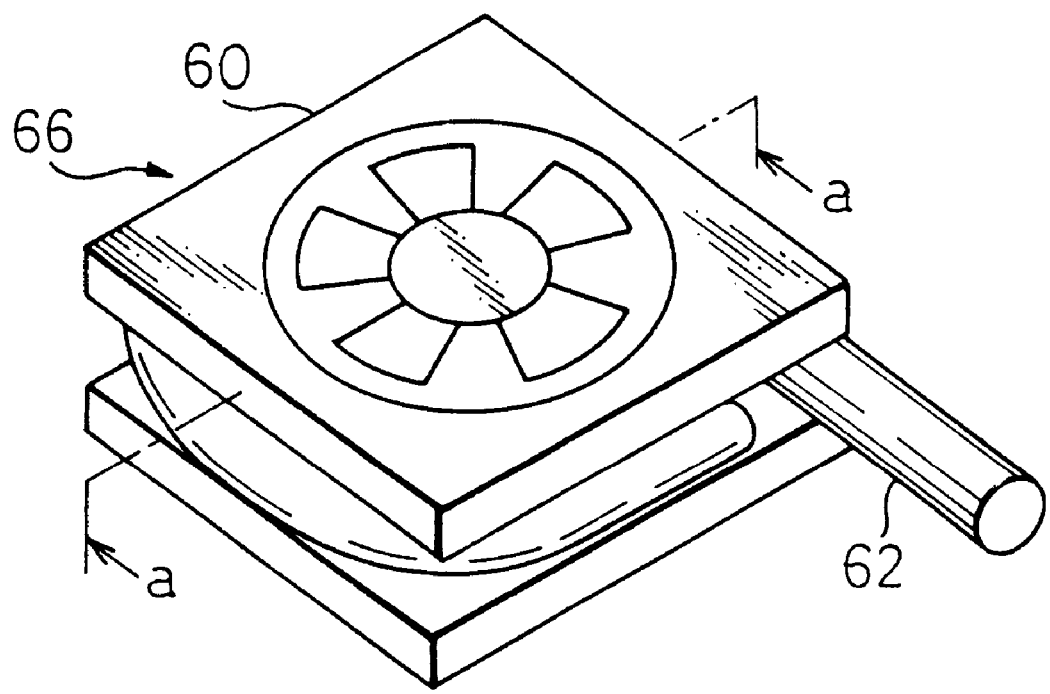
Figure 18B:
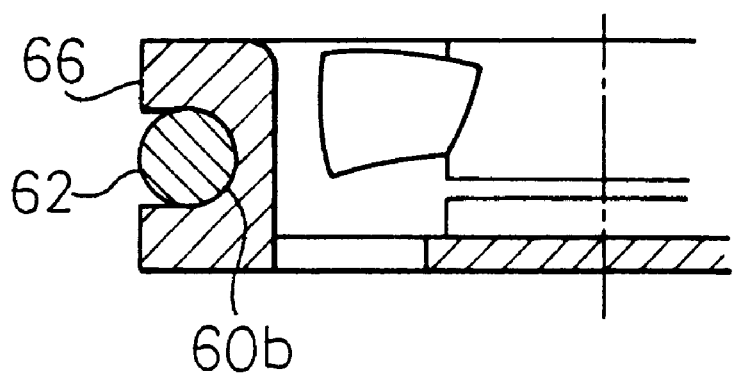

FIGS. 18A and 18B are views showing the sixteenth embodiment of the present invention. FIG. 18A is an assembled perspective view, and FIG. 18B is a cross-sectional view taken on line a—a in FIG. 18A. In the heat sink of this embodiment, the heat exchanging section of the embodiment described before is removed, and a groove 60b is formed on the outer circumference of the casing 60 of the axial blower 66, and the heat conveyance member 62 is press-fitted into this groove 60b, or alternatively the heat conveyance member 62 is made to adhere into this groove 60b by a heat conductive adhesive agent. In this connection, the casing 60 is made of the same material as that of the embodiment described before. In the heat sink of this embodiment composed as described above, the heat conveyance member 62 is made to adhere onto the outer circumference of the casing 60. Therefore, it is possible to reduce the height of the heat sink.

FIGS. 19A~19C are views showing the seventeenth embodiment of the present invention. FIG. 19A is an assembled perspective view, FIG. 19B is a cross-sectional view taken on line a—a in FIG. 19A, and FIG. 19C is a perspective view showing a variation of the heat sink. In the heat sink of this embodiment, the casing 60 of the axial blower 66 is composed of a heat conveyance member 62, the section of which is flat, and protruding portions and cutout portions are formed in the ventilation passage of the cover 61 of the axial blower 66 so as to enhance the cooling effect. In the heat sink shown in FIG. 19C, the cover 61 is formed square, and the four corners of the cover 61 is engaged with the casing 60. In the heat sink of this embodiment composed as described above, the heat conveyance member 62 is also used as the casing of the fan. Accordingly, the dimensions of the heat sink can be reduced.

Figure 20:
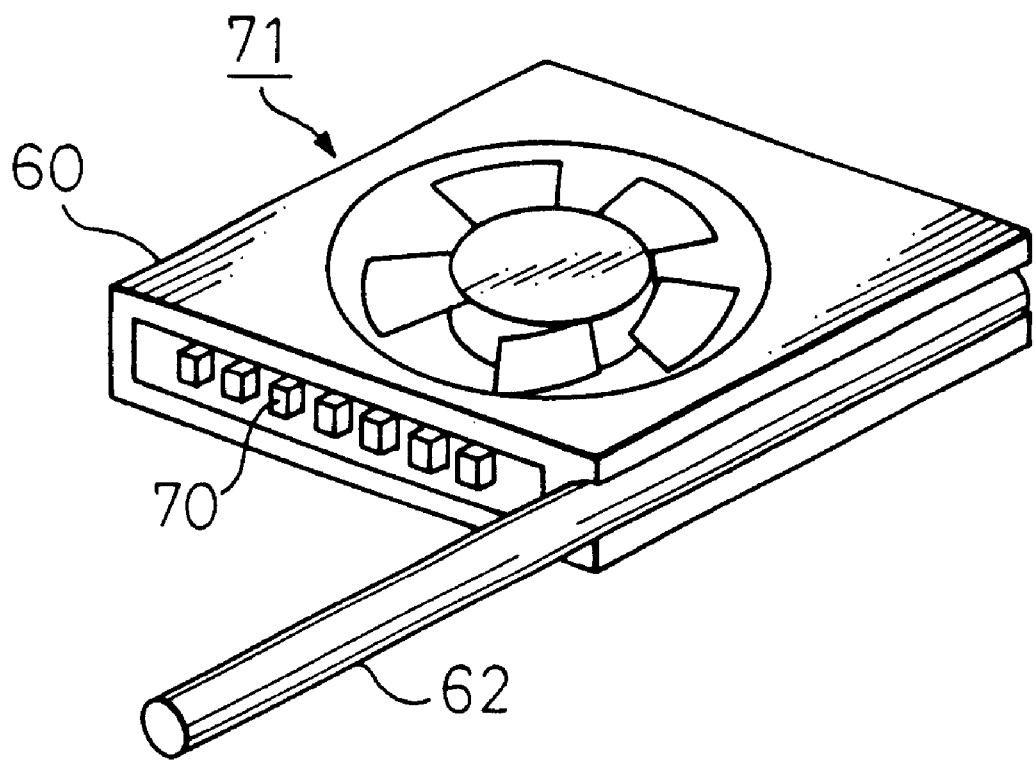
FIG. 20 is a perspective view showing the eighteenth embodiment of the present invention.

FIG. 20 is a view showing the eighteenth embodiment of the present invention. In this embodiment, on the casing 60 having radiating fins 70 and on the side of the heat sink 71 into which a fan is incorporated, a groove is formed, and the heat conveyance member 62 is made to adhere into the groove. In this embodiment composed as described above, the heat conveyance member 62 is made to adhere onto the side of the heat sink 71 into which the fan is incorporated. Accordingly, there is no contact heat resistance in this heat sink, and the cooling efficiency can be enhanced.

Figure 21A:
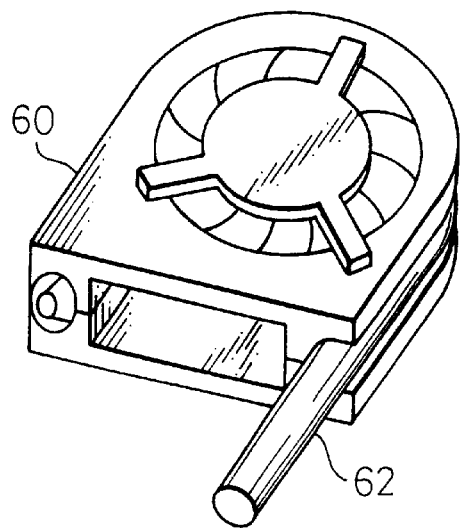
Figure 21B:
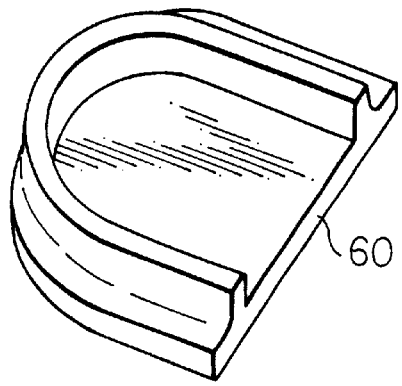
Figure 21C:
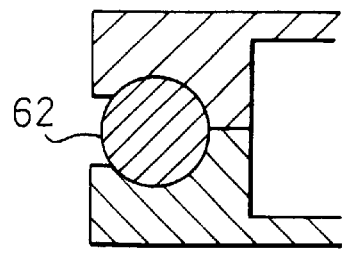

FIGS. 21A~21C are views showing the nineteenth embodiment of the present invention. FIG. 21A is a perspective view, FIG. 21B is a perspective view of the casing, and FIG. 21C is a partial cross-sectional view of FIG. 21A. This embodiment is composed in such a manner that the casing 60 described in each of the twelfth, the thirteenth and the sixteenth embodiments is horizontally divided into two parts at the groove, and other points are the same. According to this embodiment, it is easy to incorporate the heat conveyance member 62 into the apparatus. Therefore, the manufacturing property and the assembling property can be enhanced, and the manufacturing cost can be decreased.

Figure 22A:
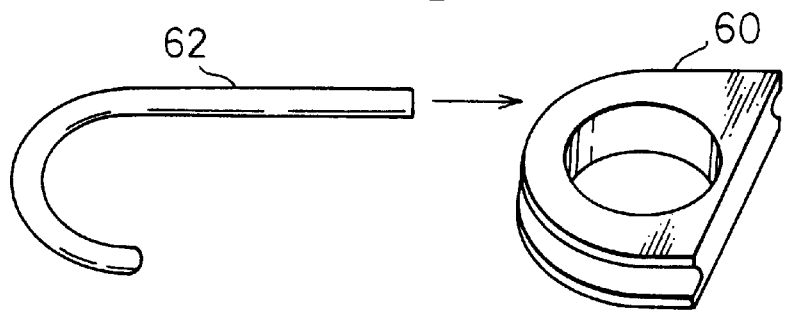
Figure 22B:
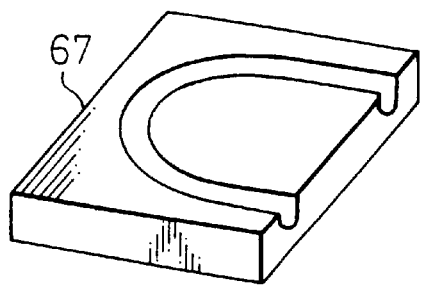
Figure 22C:
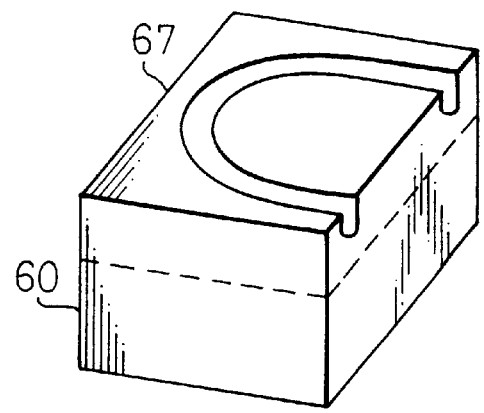
Figure 22D:
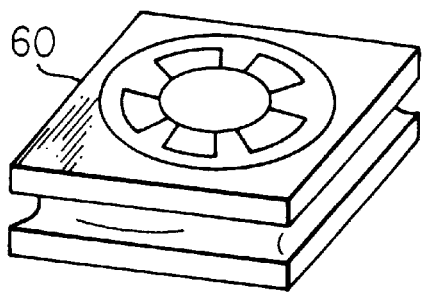
Figure 22E:
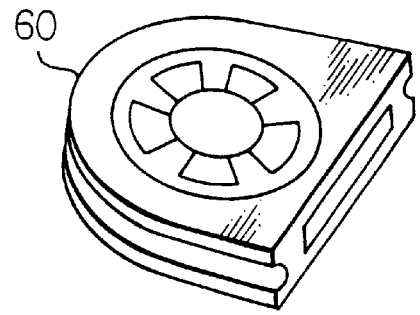

FIGS. 22A~22E are views showing the twentieth embodiment of the present invention. FIGS. 22A to 22E are views showing the casing or the heat exchanging member of each of the twelfth, the fourteenth, the fifteenth, the sixteenth and the nineteenth embodiment. The heat sink of this embodiment is composed as follows. In each of the twelfth, the fourteenth, the fifteenth, the sixteenth and the nineteenth embodiments, as shown in FIG. 22A, the heat conveyance member 62 is previously formed into a circle or a portion of a circle and made to adhere onto the casing or the heat exchanging member. In this embodiment, it is possible to increase the heat exchanging area. Therefore, the cooling efficiency can be enhanced.

Figure 23A:
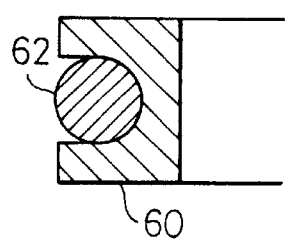
FIGS. 23A, 23B, and 23C are views showing the twenty-first embodiment of the present invention.
Figure 23B:
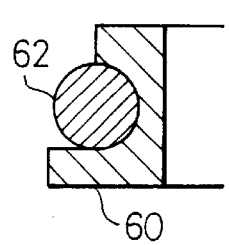
Figure 23C:
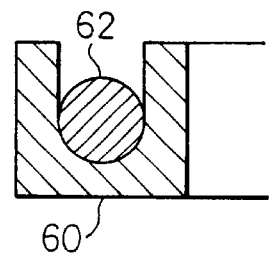

FIGS. 23A~23C are views showing the twenty-first embodiment of the present invention. This embodiment is composed as follows. In the thirteenth to the seventeenth embodiment and the nineteenth to the twenty-first embodiment which are explained above, a cross section of the groove provided on the casing 60 or the heat exchanging member 67 is formed semicircular as shown in FIGS. 23A, 23B and 23C. According to this embodiment, the area of heat exchange is increased. Therefore, the cooling efficiency can be enhanced.

Figure 24A:
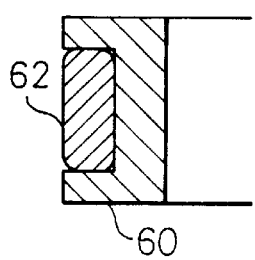
FIGS. 24A, 24B, and 24C are views showing the twenty-second embodiment of the present invention.
Figure 24B:
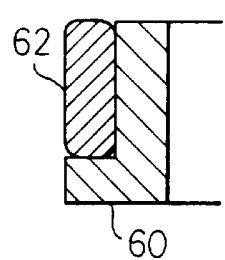
Figure 24C:
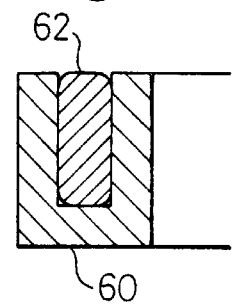

FIGS. 24A~24C are views showing the twenty-second embodiment of the present invention. This embodiment is composed as follows. In the thirteenth to the seventeenth embodiment and the nineteenth to the twenty-first embodiment which are explained above, a cross section of the heat conveyance member 62 is formed rectangular, and a cross section of the groove provided on the casing 60 or the heat exchanging member 67 is formed into a shape in accordance with the cross section of the heat conveyance member 62 as shown in FIGS. 24A, 24B and 24C. According to this embodiment, the area of heat exchange is increased. Therefore, the cooling efficiency can be enhanced.

Figure 25A:
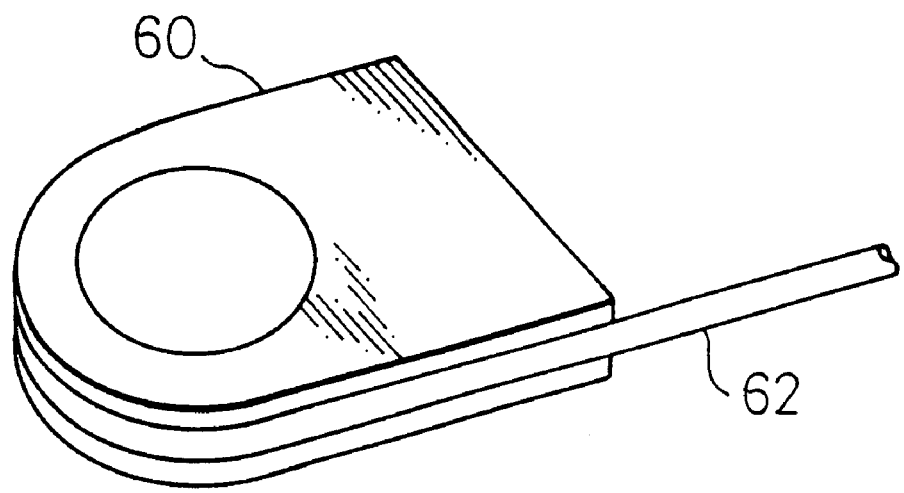
Figure 25B:
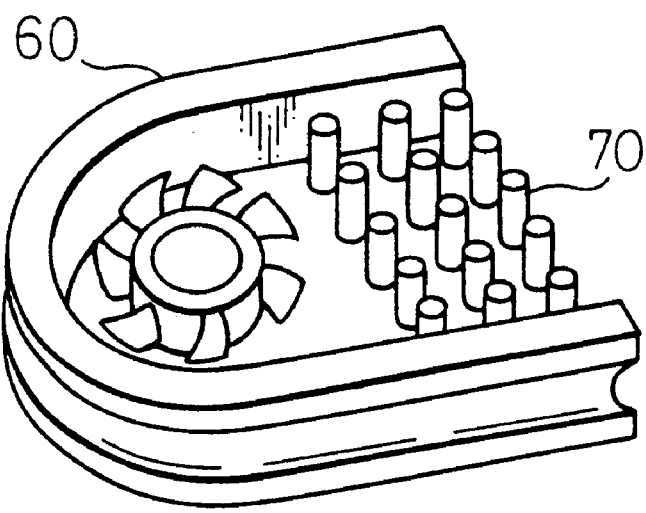

FIGS. 25A and 25B are views showing the twenty-third embodiment of the present invention. FIG. 25A is a perspective view, and FIG. 25B is a perspective view showing a state in which the cover is removed. This embodiment is composed as follows. In the twelfth and the thirteenth embodiments, radiating fins 70 made of the same material as that of the casing 60 are provided in a portion close to the discharge port of the fan. According to this embodiment, air which has been discharged from the fan blows against the radiating fins 70. Therefore, the cooling efficiency can be enhanced.

Figure 26A:
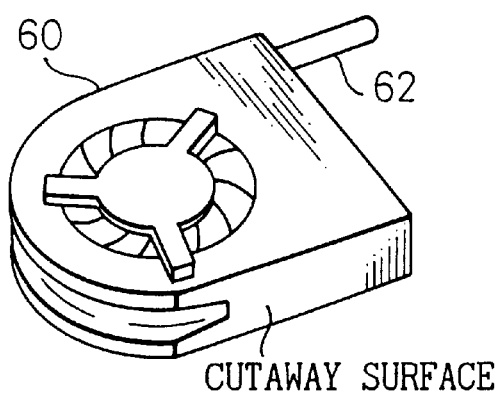
Figure 26B:
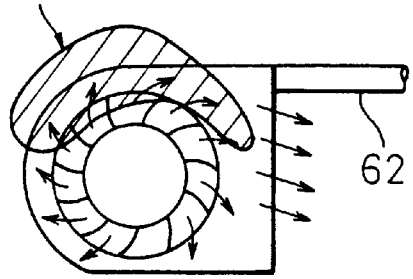

FIGS. 26A and 26B are views showing the twenty-fourth embodiment of the present invention. FIG. 26A is a perspective view, and FIG. 26B is a schematic illustration showing a mode of operation. This embodiment is composed as follows. In each of the twelfth, the thirteenth and the twenty-third embodiments described before, the heat exchanging section in which heat is exchanged with the heat conveyance member 62, is provided on the casing onto which a high air pressure is given and also on the side portion of the heat sink body adjacent to the casing portion. According to this embodiment, the heat exchanging section in which heat is exchanged with the heat conveyance member 62 is provided in a portion where the cooling efficiency is high because a high air pressure is given to the portion by the fan. Accordingly, while the deterioration of performance is minimized, the dimensions of the heat sink can be reduced.

Figure 27A:
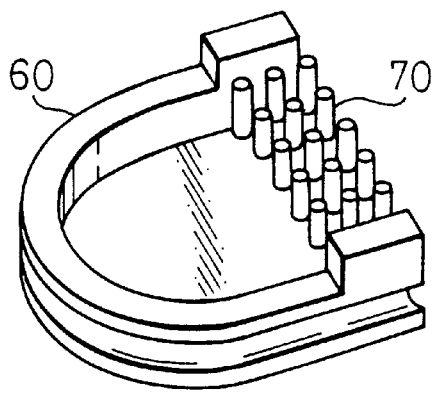
Figure 27B:
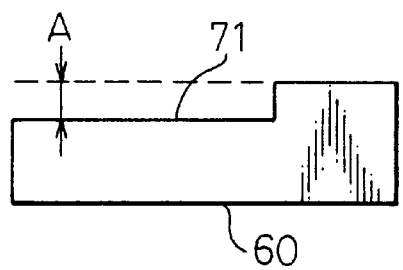

FIGS. 27A and 27B are views showing the twenty-fifth embodiment of the present invention. FIG. 27A is a perspective view showing a state in which the cover is removed, and FIG. 27B is a side view. This embodiment is composed as follows. In each of the twelfth, the twenty-third and the twenty fourth embodiments, the height of the radiating fin 70 is increased so that the required air gap A of the sucking section 71 can be ensured. According to this embodiment, only a portion necessary for sucking air is open, and a portion not necessary for sucking air is utilized for increasing the radiating area. Therefore, the cooling efficiency can be enhanced.

Figure 28:
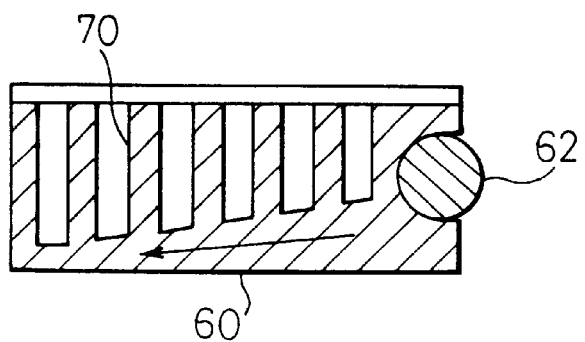
FIG. 28 is a cross-sectional view showing the twenty-sixth embodiment of the present invention.

FIG. 28 is a cross-sectional view showing the twenty-sixth embodiment of the present invention. This embodiment is composed as follows. In each of the twenty-fourth and the twenty-fifth embodiments described before, the thickness of the base at the bottom on which the radiating fins 70 are provided is made thick in a portion close to the heat exchanging section in which heat is exchanged with the heat conveyance member 62, and the thickness of the base is made thin as it becomes distant from the heat exchanging section. According to this embodiment, heat in the heat exchanging section, the temperature of which is high, is diffused and conducted to other portions. Accordingly, the cooling efficiency can be enhanced.

Figure 29A:
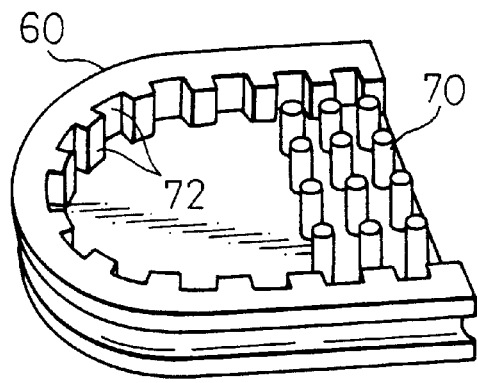
Figure 29B:
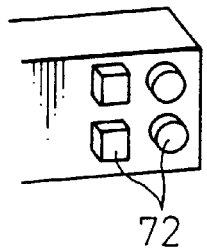

FIGS. 29A and 29B are views showing the twenty-seventh embodiment of the present invention. FIG. 29A is a perspective view showing a state in which the cover is removed, and FIG. 29B is a partial enlarged view. This embodiment is composed as follows. In each of the twenty-third to the twenty-sixth embodiments, a radiating section 72, the shape of which is protruded and cutout, is provided on the inner circumferential surface of the casing 60 except for the outlet portion of the fan and also provided on the inner surface of the casing 60 opposed to the radiating fins. FIG. 29B is a view showing another example of the radiating section 72. According to this embodiment, a turbulent flow is caused by the radiating section 72, the shape of which is protruded and cutout, in a portion where the air pressure is highest and also in a portion closest to the heat exchanging section of high temperature. Accordingly, the cooling efficiency can be enhanced.

Figure 30:
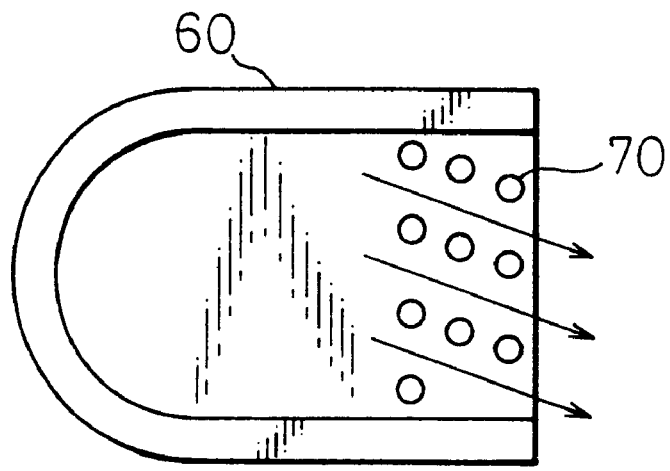
FIG. 30 is a plan view showing the twenty-eighth embodiment of the present invention, wherein this view shows a state in which the cover is removed.

FIG. 30 is a plan view of the twenty-eighth embodiment of the present invention, wherein the view shows a state in which the cover is removed. This embodiment is composed as follows. In each of the twenty-third to the twenty-seventh embodiments, the radiating fins 70 are arranged in a portion close to the outlet of the fan in such a manner that straight lines connecting the fins are made to be parallel with the direction of a wind discharged from the fan. According to this embodiment, the resistance can be reduced in the blowing direction of a wind. Therefore, a quantity of ventilating air can be increased, and the cooling efficiency can be enhanced.

Figure 31:
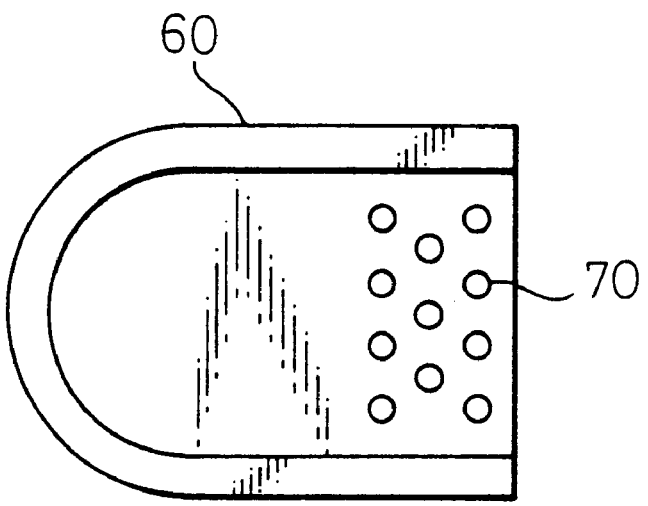
FIG. 31 is a plan view showing the twenty-ninth embodiment of the present invention, wherein this view shows a state in which the cover is removed.

FIG. 31 is a plan view of the twenty-ninth embodiment of the present invention, wherein the view shows a state in which the cover is removed. This embodiment is composed as follows. In each of the twenty-third to the twenty-seventh embodiments, the radiating fins 70 are arranged at random in a portion close to the outlet of the fan. According to this embodiment, although the resistance to the flow of a air is increased, the cooling efficiency can be enhanced by the effect of a turbulent flow.

Figure 32A:
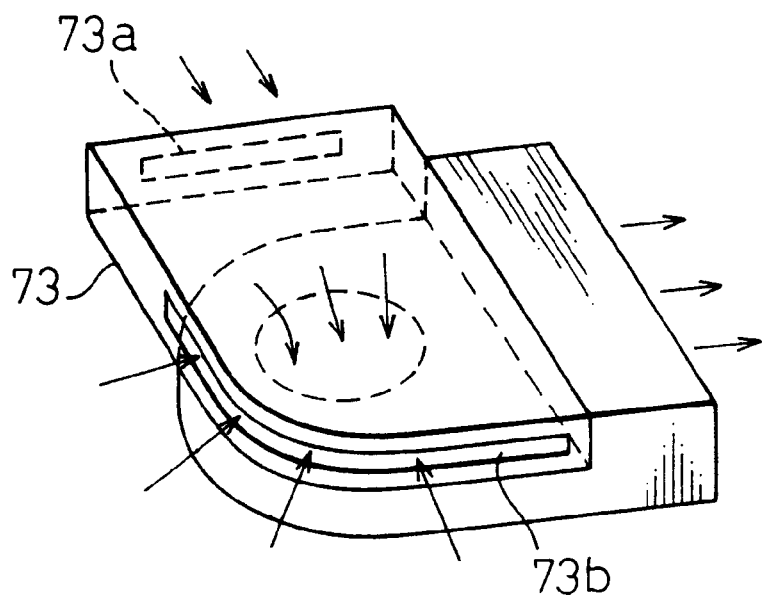
Figure 32B:
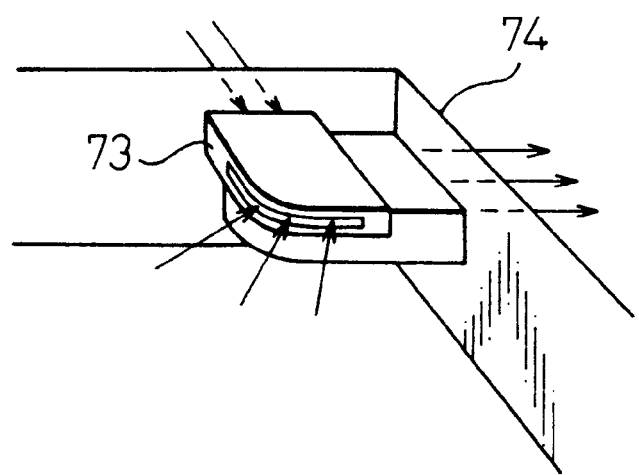

FIGS. 32A and 32B are views showing the thirtieth embodiment of the present invention. FIG. 32A is a perspective view, and FIG. 32B is a view showing a state of use of the heat sink. This embodiment is composed as follows. In each of the twenty-third to the twenty-eighth embodiments, as shown in FIG. 32A, there is provided a guide 73 at the inlet of the fan, wherein the guide 73 has an outside air suction port 73a and an inside air suction port 73b to determine a ratio of a quantity of the outside air to be sucked to a quantity of the inside air to be sucked. As shown in FIG. 32B, the guide 73 is attached to the casing 74 of the apparatus.

Figure 33A:
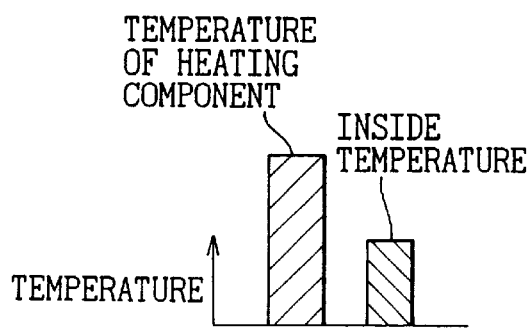
FIGS. 33A, 33B, 33C, and 33D are schematic views for explaining a method of use of the thirtieth embodiment of the present invention.
Figure 33B:
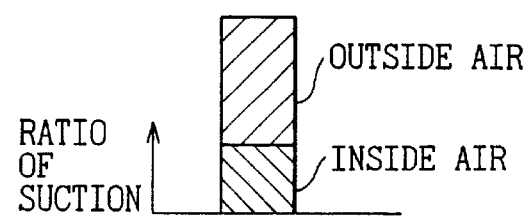
Figure 33C:
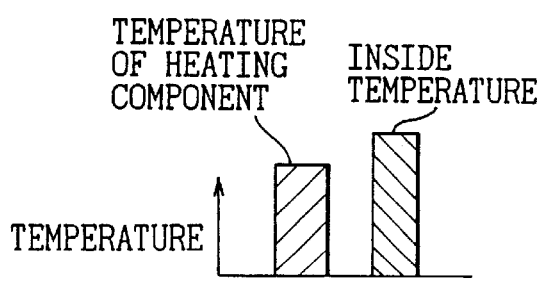
Figure 33D:
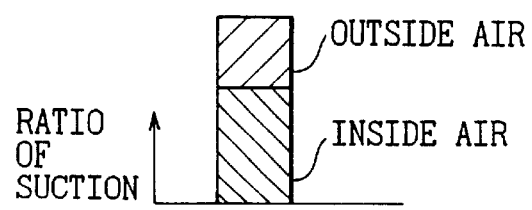

In this embodiment, the cooling operation is performed as follows. As shown in FIG. 33A, when a quantity of heat generated by the heating component such as an MPU is large and the temperature in the casing is low, as shown in FIG. 33B, a quantity of outside air to be sucked is increased and a quantity of inside air to be sucked from the inside of the casing is decreased. On the contrary, as shown in FIG. 33C, when a quantity of heat generated by the heating component such as an MPU is small and the temperature in the casing is high, as shown in FIG. 33D, a quantity of outside air to be sucked is decreased and a quantity of inside air to be sucked from the inside of the casing is increased. In this way, when the outside air, the temperature of which is relatively low, is taken in, the cooling efficiency can be enhanced and the cooling efficiency of the apparatus can be enhanced.

Figure 34:
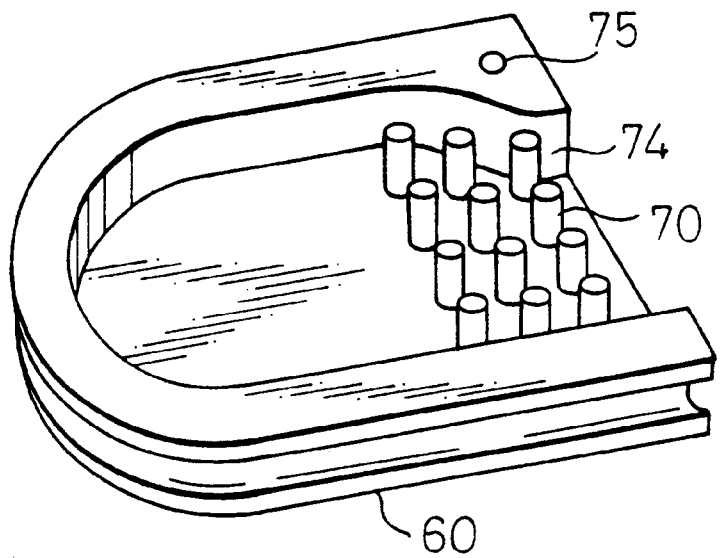
FIG. 34 is a perspective view of the thirty-first embodiment of the present invention, wherein this view shows a state in which the cover is removed.

FIG. 34 is a perspective view of the thirty-first embodiment of the present invention, wherein the view shows a state in which the cover is removed. This embodiment is composed as follows. In each of the twenty-third to the twenty-ninth embodiments, there is provided a protruding section 74 in the air flow direction at the edge on the high wind pressure side of the fan in the radiating fin forming section 70 located close to the outlet of the fan. According to this embodiment, the protruding section is formed in a portion where the air flow is weakest, that is, the protruding section is formed at a dead zone. Accordingly, while the deterioration of the air-flow efficiency is minimized, the screw hole 75 can be formed in this protruding section so as to fix the cover.

Figure 35:
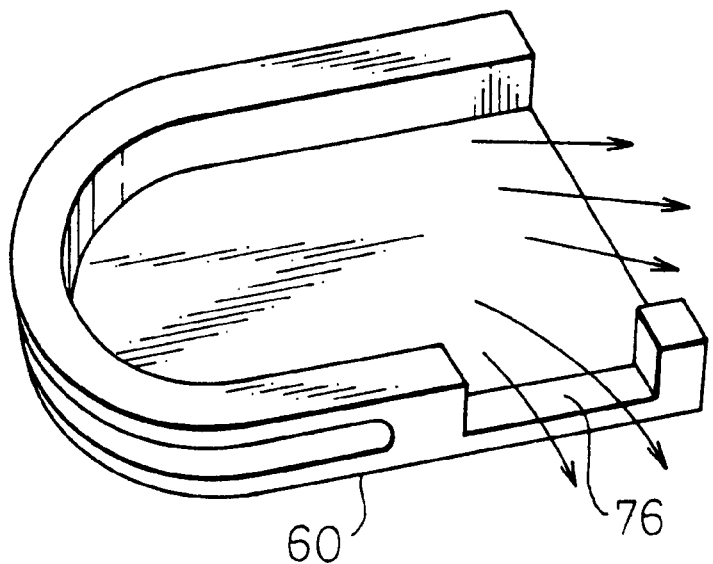
FIG. 35 is a perspective view of the thirty-second embodiment of the present invention, wherein this view shows a state in which the cover is removed.

FIG. 35 is a perspective view of the thirty-second embodiment of the present invention, wherein the view shows a state in which the cover is removed. This embodiment is composed as follows. In each of the twenty-third to the thirtieth embodiments, there is provided a hole 76, in which air flows, on the side on the low wind pressure side of the fan in the radiating fin forming section 70 located close to the outlet of the fan. According to this embodiment, an area of the opening in which air sent from the fan passes can be increased irrespective of heat exchange. Therefore, the cooling efficiency can be enhanced.

Figure 36:
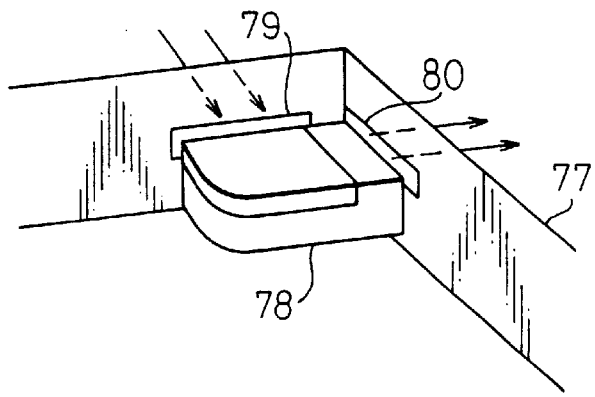
FIG. 36 is a perspective view of the thirty-third embodiment of the present invention.

FIG. 36 is a perspective view of the thirty-third embodiment of the present invention. This embodiment relates to a mounting structure of the information processor. In this structure, there is provided a suction port 79 of the heat sink 78 on one surface of the corner section of the apparatus 77, and there is provided a discharge port 80 of the heat sink 78 on the other surface. According to this embodiment, the heat sink is located at the corner of the casing. Therefore, it is not necessary to provide an air duct. Accordingly, the manufacturing cost of the apparatus can be reduced.

Figure 37:
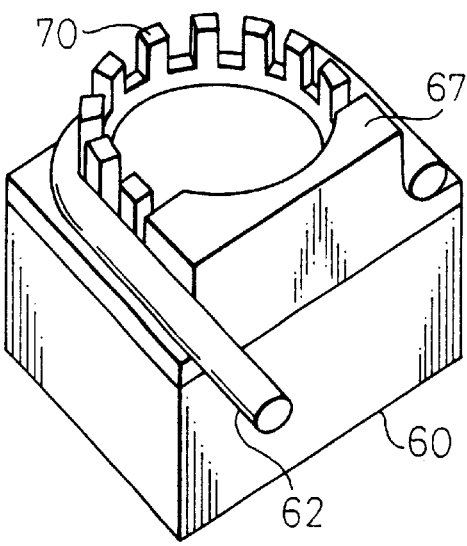
FIG. 37 is a perspective view of the thirty-fourth embodiment of the present invention.

FIG. 37 is a perspective view of the thirty-fourth embodiment of the present invention. This embodiment is composed as follows. In the fifteenth embodiment, there are provided radiating fins 70 used for heat radiation at the edge close to the heat exchanging section 67. According to this embodiment, the radiating fins 70 are arranged at positions closest to the heat exchanging section 67 of high temperature. Therefore, air close to the fan blows against the radiating fins 70. Accordingly, the cooling efficiency can be enhanced.

Figure 38:
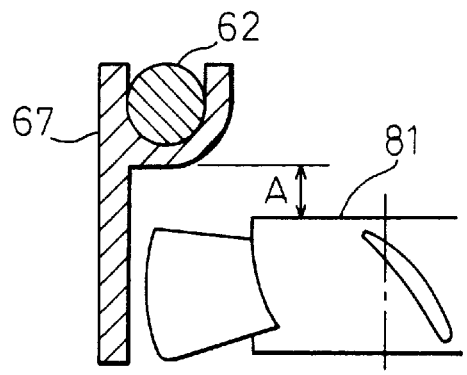
FIG. 38 is a perspective view of the thirty-fifth embodiment of the present invention.

FIG. 38 is a perspective view of the thirty-fifth embodiment of the present invention. This embodiment is composed as follows. In each of the fourteenth and the fifteenth embodiments, there is provided an air gap A between the blades 81 of the fan and the heat exchanging section 67. According to this embodiment, the air gap A is formed between the blades 81 of the fan and the heat exchanging section 67. Therefore, it is possible to reduce the intensity of noise.

Figure 39A:
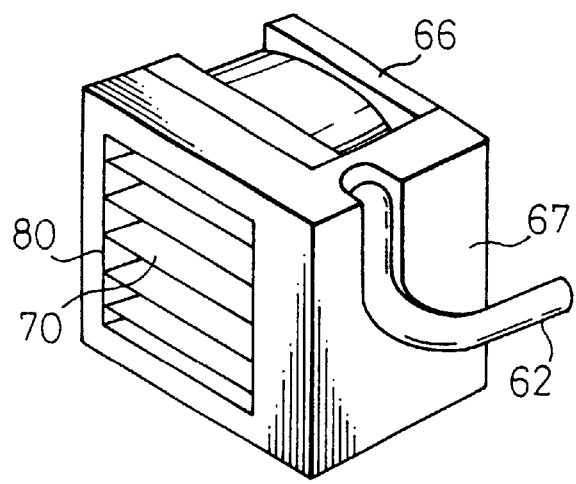
Figure 39B:
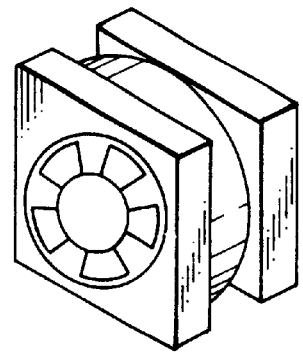
Figure 39C:
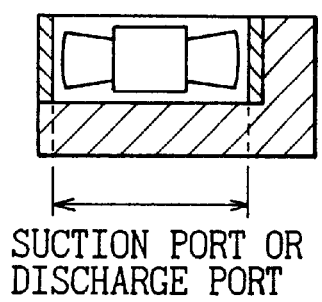
Figure 39D:
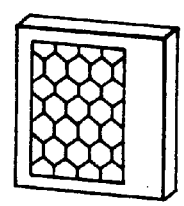

FIGS. 39A-39D are views of the thirty-sixth embodiment of the present invention. FIG. 39A is a perspective view, FIG. 39B is a perspective view of the fan, FIG. 39C is a cross-sectional view, and FIG. 39D is a view showing another example of the fin. This embodiment is composed of a heat exchanging section 67 for exchanging heat to which the heat conveyance member 62 is made to adhere, and also composed of an axial blower 66. In this embodiment, a portion of the heat exchanging section 67 is arranged on the side of the blower 66, and the radiating fins 70 of the heat exchanging section 67 are arranged at the suction port of the blower 66 or at the discharge port 80. According to this embodiment, there is provided a ventilation passage inside the heat exchanging section 67. Therefore, while the deterioration of the air-flow efficiency is minimized, the air inside the apparatus can be exhausted, and the heat conveyed by the heat conveyance member 62 can be diffused. Consequently, the cooling efficiency of the apparatus can be enhanced.

Figure 40A:
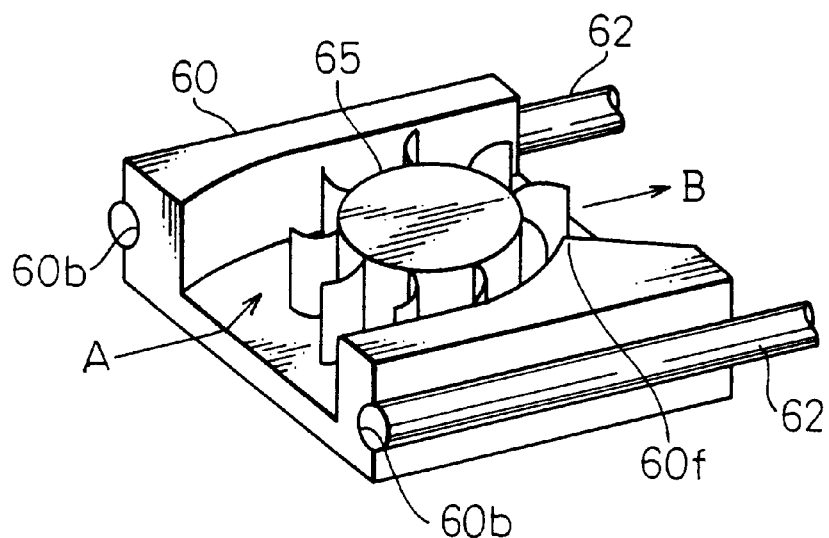
Figure 40B:
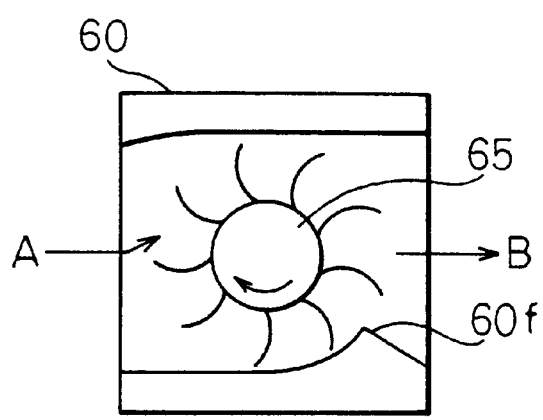
Figure 40C:
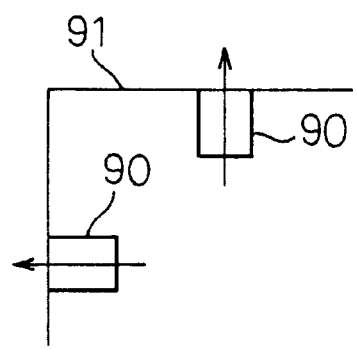

FIGS. 40A-40C are views showing the thirty-seventh embodiment of the present invention. FIG. 40A is a perspective view of the heat sink from which the cover is removed. FIG. 40B is a plan view of the heat sink from which the cover is removed. FIG. 40C is a view for explaining the mounting position in the apparatus. As shown in FIGS. 40A and 40B, the heat sink of this embodiment is composed as follows. There are provided longitudinal walls in the transverse direction of the casing 60 made of heat-conductive resin or metal. Between the longitudinal walls, there is provided a cross flow fan 65. Inside of one of the walls, there is provided a protrusion 60f for guiding a cooling wind, and this protrusion 60f is arranged close to the blades of the fan. On the right and the left wall, there are formed grooves 60b into which the heat transmitting member 62 is press-fitted or bonded.

The cross flow fan 65 sucks air as shown by arrow A in the drawing and discharges air as shown by arrow B. As described above, the air sucking direction and the air discharging direction are aligned on a straight line in the heat sink 90 of this embodiment. Accordingly, as shown in FIG. 40C, as long as the heat sink is arranged along the inner wall, it can be arranged at any position. Therefore, the degree of freedom to determine its mounting position in the apparatus 91 can be enhanced.

Figure 41A:
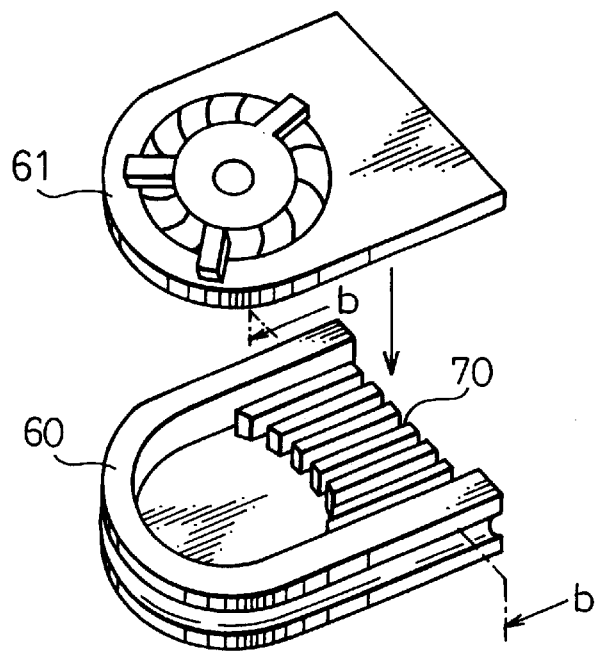
Figure 41B:
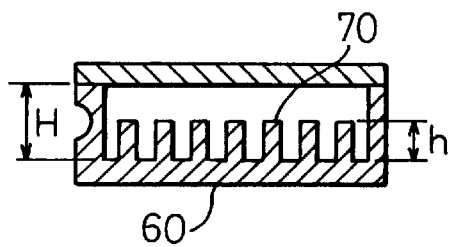
Figure 41C:
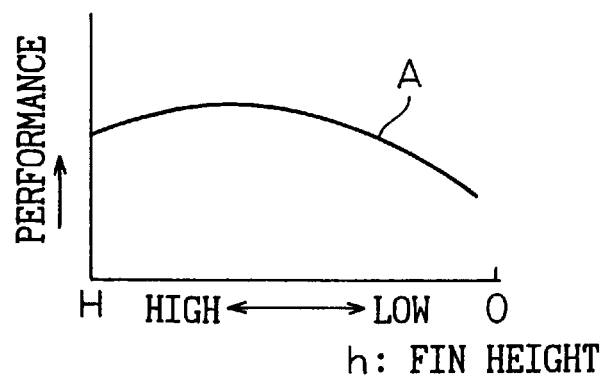

FIGS. 41A-41C are views showing the thirty-eighth embodiment of the present invention. FIG. 41A is a perspective view of the heat sink from which the cover is removed. FIG. 41B is a cross-sectional view. FIG. 41C is a performance curve sheet. This embodiment is substantially the same as the twenty-third embodiment explained in FIGS. 25A and 25B. Different points of this embodiment, compared to the twenty-third embodiment are that the radiating fins 70 are formed linear, the heights of the radiating fins 70 are lowered, and a space is formed in an upper position of the radiating fins 70.

The performance curve of this embodiment is shown by curve A in FIG. 41C in which the horizontal axis represents the height h of the radiating fin 70 and the vertical axis represents the performance. In this case, H represents a height of the space formed in the casing 60 as shown in FIG. 41B, and h represents the height of the fin 70 as shown in FIG. 41C. As shown by the performance curve, when a space is formed in the upper portion of the radiating fins 70, the performance can be enhanced as compared with a case in which no space is formed. The reason why the performance can be enhanced when a space is formed in the upper portion of the radiating fins 70 is that a rate of flow of air is increased.

Figure 42:
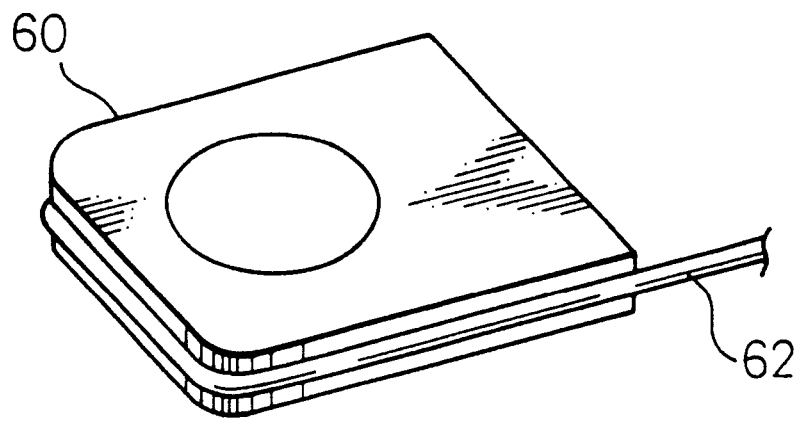
FIG. 42 is a perspective view showing the thirty-ninth embodiment of the present invention.

FIG. 42 is a perspective view showing the thirty-ninth embodiment of the present invention. This embodiment is substantially the same as the twenty-third embodiment explained in FIGS. 25 and 25B. A different point is described as follows. When the pipe-shaped heat transmitting member 62 is arranged on the outside of the casing 60, the casing 60 is formed into a shape so that the radius of curvature of the heat transmitting member 62 can become minimum as long as the heat transmitting member 62 can be formed. Due to the above arrangement, the contact area of the heat transmitting member with the casing 60 is extended, so that the cooling performance can be enhanced.

Figure 43:
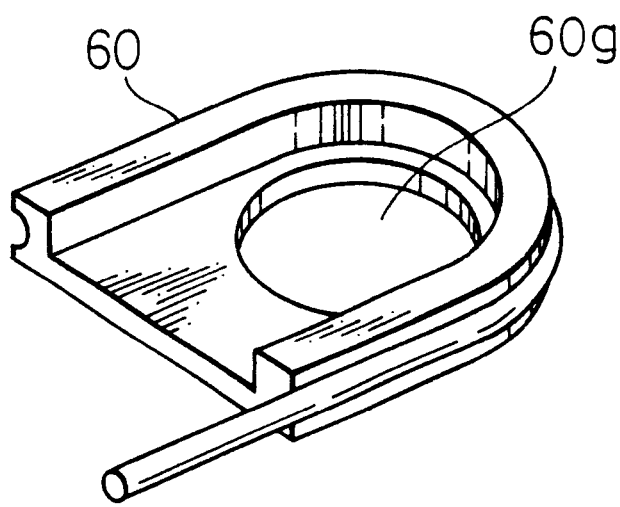
FIG. 43 is a perspective view showing the fortieth embodiment of the present invention.

FIG. 43 is a perspective view showing the fortieth embodiment of the present invention. This embodiment is substantially the same as the twelfth embodiment explained in FIGS. 14A–14C. A point of difference is described as follows. The bottom portion of the casing 60 is removed, and an opening 60g larger than the diameter of the fan blades is formed and the fan blades are partially inserted into the opening. When the bottom portion of the casing 60 is removed, the height of the casing 60 is reduced in accordance with the removal of the bottom portion. Accordingly, the heat sink can be made thin.

Figure 44A:
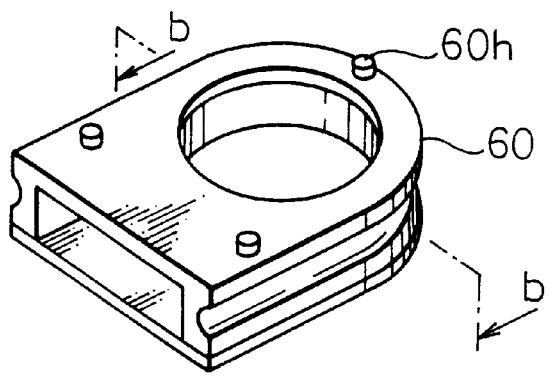
Figure 44B:
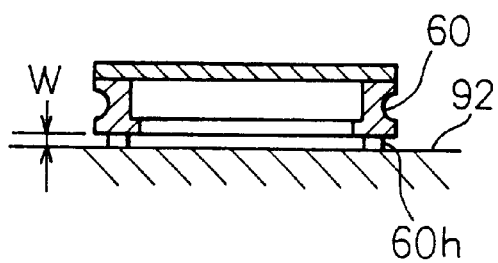
Figure 44C:
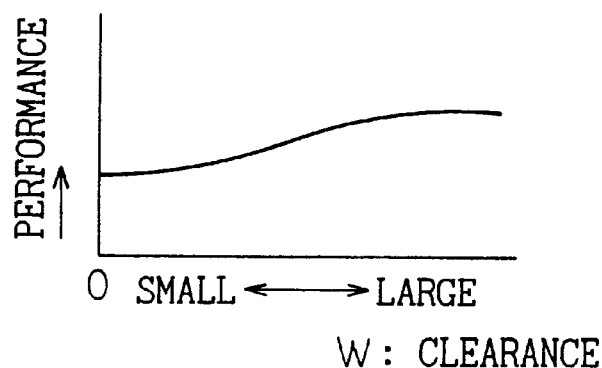

FIGS. 44A–44C are views showing the forty-first embodiment of the present invention. FIG. 44A is a perspective view taken from the reverse side. FIG. 44B is a cross-sectional view taken on line b—b in FIG. 44A. FIG. 44C is a performance curve sheet showing a relation between the clearance and the performance. This embodiment is substantially the same as the embodiment described before. A point of difference is that a plurality of protrusions 60h are formed on the bottom surface of the casing 60. In this connection, these protrusions 60h may be formed integrally with the casing 60, or alternatively, instead of the plurality of protrusions, a different spacer may be bonded. As shown in FIG. 44B, there is formed a clearance w between the casing 60 and the structure 92 when the casing 60 is mounted on the structure 92, so that air can circulate in the clearance w. Accordingly, the performance can be enhanced to some extent by the thus formed clearance w.

Figure 45A:
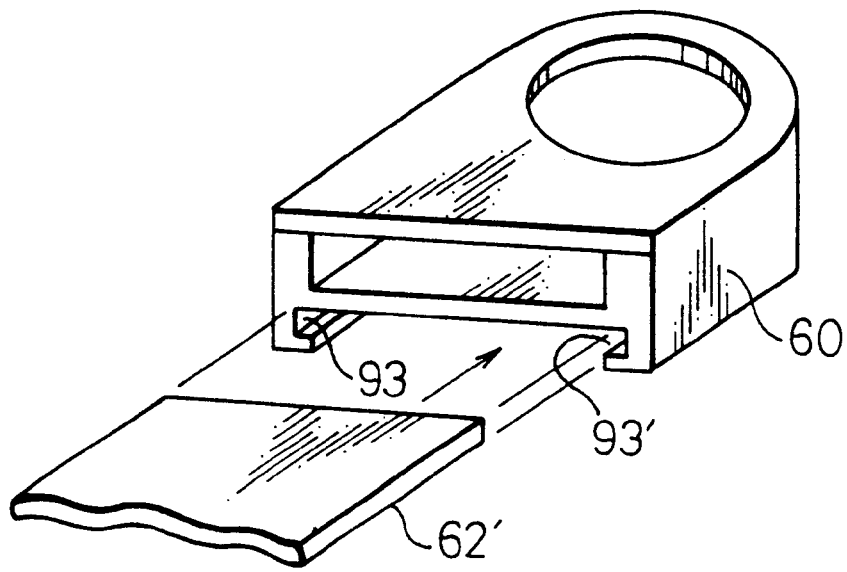
Figure 45B:
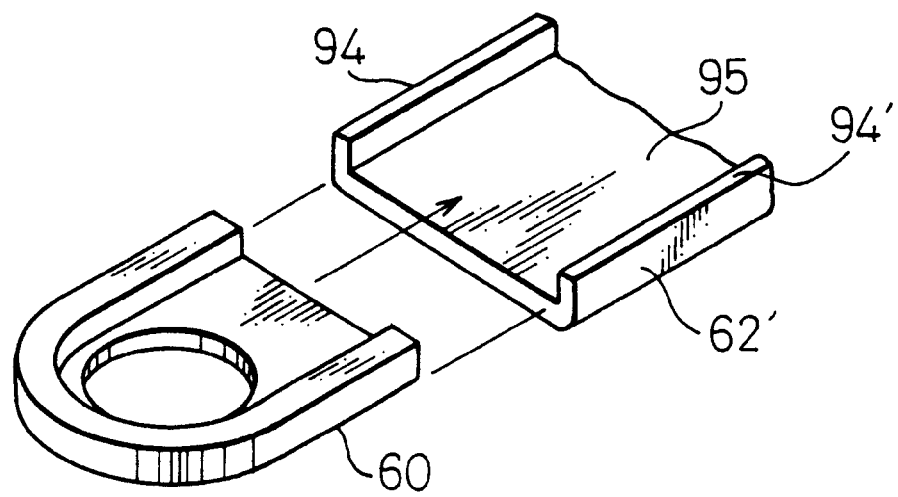

FIGS. 45A and 45B are perspective views showing the forty-second embodiment of the present invention. This embodiment is substantially the same as the fortieth embodiment explained in FIG. 43. A point of difference is that the pipe-shaped heat transmitting member 62 in the fortieth embodiment is changed into the flat type heat transmitting member 62' in this forty-second embodiment of the present invention. The heat sink of this embodiment is composed as follows. As shown in FIG. 45A, there are provided engaging grooves 93, 93' on the right and left of the bottom portion of the casing 60, and the flat type heat transmitting member 62' is inserted into and connected with these engaging grooves 93, 93'. Alternatively, as shown in FIG. 45B, there are provided rising portions 94, 94' on the right and left of the flat type heat transmitting member 62', so that the heat transmitting region 95 can be formed, and the casing 60 is attached to this heat transmitting region 95. Since the heat transmitting member is formed flat in this embodiment, the contact area of the heat transmitting member with the casing is extended. Consequently, a quantity of heat transmitted by the heat transmitting member is increased, so that the cooling performance can be enhanced.

It is to be understood that the invention is by no means limited to the specific embodiments illustrated and described herein, and that various modifications thereof may be made which come within the scope of the present invention as defined in the appended claims.

What is claimed is:

1. A heat sink comprising: a heat conveyance member for transmitting heat generated by a heating component; and a centrifugal blower section composed of a cover having blades and a drive motor and also composed of a casing made of a highly conductive material having a C-shaped outer circumference wall with an open side, wherein the heat conveyance member is attached to the C-shaped outer circumferential wall of the casing over the entire curved length of the C-shaped wall, and wherein an air outlet is formed in the open side of the casing.

2. A heat sink comprising: a heat conveyance member for transmitting heat generated by a heating component; and a cross flow fan section composed of blades and a drive motor and also composed of a casing made of a highly conductive material having a C-shaped outer circumference wall with an open side, wherein the heat conveyance member is attached to the C-shaped outer circumferential wall of the casing over the entire curved length of the C-shaped wall, and wherein an air outlet is formed in the open side of the casing.

3. A heat sink comprising: a heat conveyance member for transmitting heat generated by a heating component; and an axial blower section having blades, a drive motor and a casing made of a highly conductive material having a C-shaped outer circumference wall with an open side, wherein the heat conveyance member is attached to the C-shaped outer circumferential wall of the casing over the entire curved length of the C-shaped wall, and wherein an air outlet is formed in the open side of the casing.

4. The heat sink according to claim 1 or 2, wherein a heat exchanging section to exchange heat with the heat conveyance member is provided on the casing portion exposed to a high air pressure from the fan, and on the side portion of a heat sink body adjacent to the casing portion.

5. A heat sink, comprising:
a heat conveyance member for transmitting heat generated by a heating component;
a cooling fan having at least blades and a drive motor; and
a casing made of a highly conductive material and having a C-shaped outer circumference wall with an open side, wherein the heat conveyance member is attached to the C-shaped outer circumferential wall of the casing over the entire curved length of the C-shaped wall, and wherein an air outlet is formed in the open side of the casing.

* * * * *